(12) United States Patent
Vankayalapati et al.

(10) Patent No.: US 11,585,844 B1
(45) Date of Patent: Feb. 21, 2023

(54) SYSTEMS, CIRCUITS, AND METHODS TO DETECT GATE-OPEN FAILURES IN MOS BASED INSULATED GATE TRANSISTORS

(71) Applicant: Board of Regents, The University of Texas System, Austin, TX (US)

(72) Inventors: Bhanu Teja Vankayalapati, Richardson, TX (US); Bilal Akin, Richardson, TX (US); Shi Pu, Plano, TX (US); Fei Yang, Plano, TX (US); Masoud Farhadi, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 17/470,064

(22) Filed: Sep. 9, 2021

(51) Int. Cl.
*G01R 31/26* (2020.01)

(52) U.S. Cl.
CPC ..... *G01R 31/2623* (2013.01); *G01R 31/2601* (2013.01)

(58) Field of Classification Search
CPC .... G01R 31/26; G01R 31/26; G01R 31/1262; G01R 31/12623; G01R 31/2625; G01R 31/2626; G01R 31/2628; G01R 31/2639
(Continued)

(56) References Cited

U.S. PATENT DOCUMENTS

| | | | |
|---|---|---|---|
| 2014/0078629 A1* | 3/2014 | Cortigiani | H03K 17/24 361/79 |
| 2014/0132312 A1* | 5/2014 | Balogh | H03K 17/06 327/109 |

(Continued)

OTHER PUBLICATIONS

C. Delepaut, S. Siconolfi, O. Mourra, and F. Tonicello, "MOSFET gate open failure analysis in power electronics," in 2013 Twenty-Eighth Annual IEEE Applied Power Electronics Conference and Exposition (APEC), pp. 189-196, 2013.

(Continued)

*Primary Examiner* — Jermele M Hollington
*Assistant Examiner* — Courtney G McDonnough
(74) *Attorney, Agent, or Firm* — Stanek Lemon Crouse & Meeks, P.A.

(57) ABSTRACT

A system to detect gate-open failures in a MOS based insulated gate transistor can include a detection circuit, including a first circuit configured to measure a drain-source voltage across the MOS based insulated gate transistor, a first comparator circuit can be configured to compare the measured drain-source voltage to a threshold drain-source conduction voltage indicating a conduction state of a channel of the MOS based insulated gate transistor, a second circuit can be configured to measure a gate voltage applied at a gate of the MOS-based insulated gate transistor, a second comparator circuit can be configured to compare the gate voltage applied at the gate to a threshold gate voltage for the MOS based insulated gate transistor to provide an indication of whether the gate voltage applied at the gate is sufficient to activate conduction in the channel and a logic circuit can be configured to detect a gate-open failure of the MOS based insulated gate transistor based on the conduction state of the channel and the indication of whether the gate voltage applied at the gate is sufficient to activate conduction in the channel when the MOS based insulated gate transistor is in an on state or an off state.

24 Claims, 17 Drawing Sheets

(58) Field of Classification Search
USPC .................................................. 324/762.09
See application file for complete search history.

(56) References Cited

U.S. PATENT DOCUMENTS

2014/0197882 A1\* 7/2014 Prabhakar, III ......... H01L 24/00
                                                            438/106
2019/0227613 A1\* 7/2019 Chen ..................... G06F 1/3296
2021/0376712 A1\* 12/2021 Chen ..................... H02M 3/335

OTHER PUBLICATIONS

N. C. Remo and J. C. M. Fernandez, "A reliable failure analysis methodology in analyzing the elusive gate-open failures," in Proceedings of the 12th International Symposium on the Physical and Failure Analysis of Integrated Circuits, 2005. IPFA 2005, pp. 185-189, 2005.

\* cited by examiner

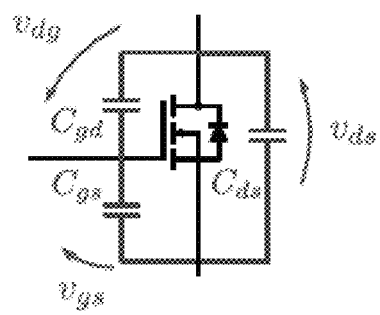
(a)
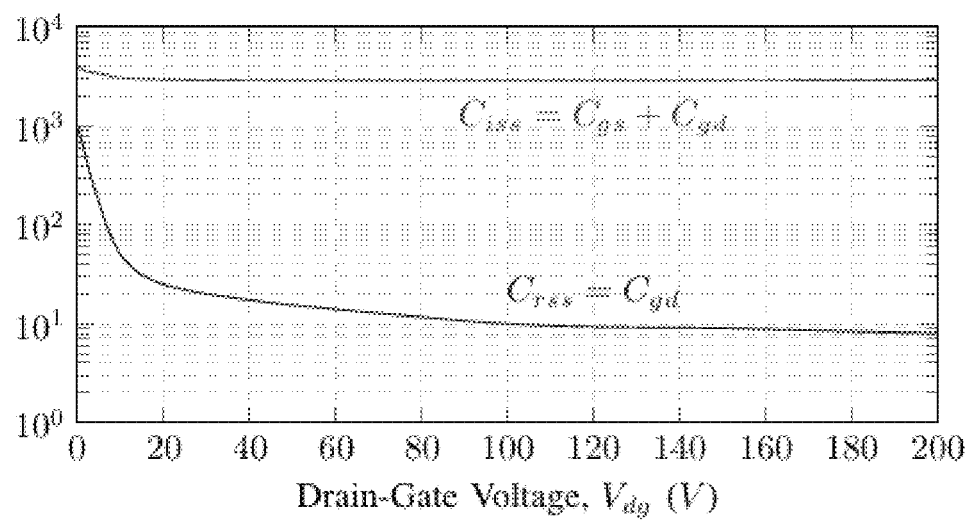
(b)
FIGs. 3a – b

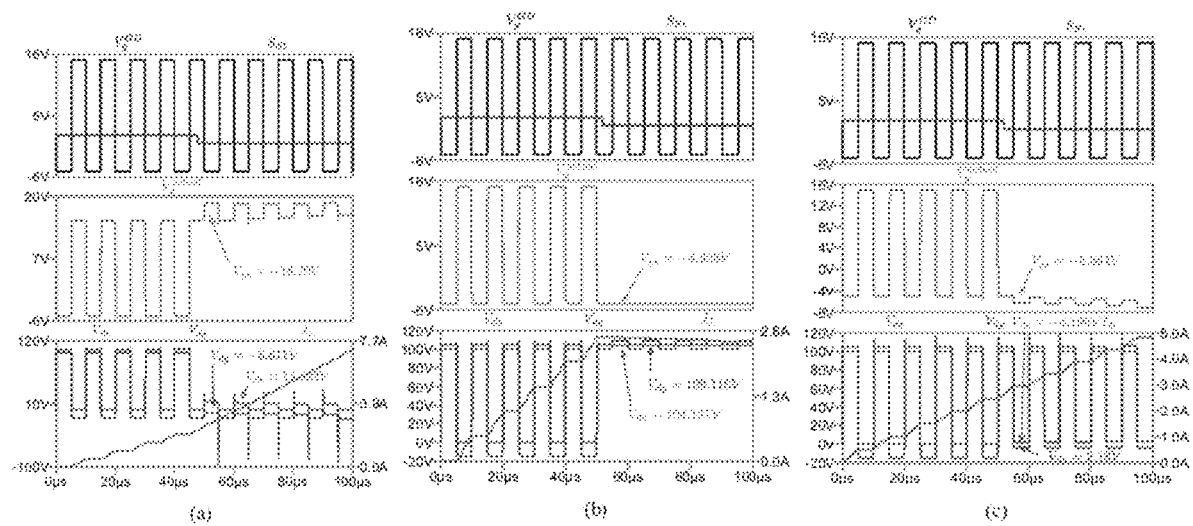
FIGs. 4a – c
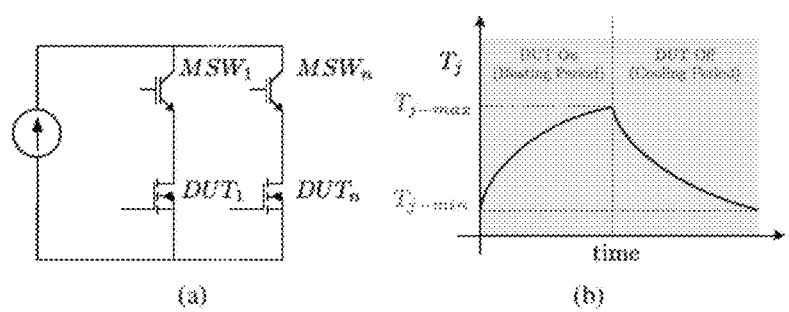
FIGs. 5a – b

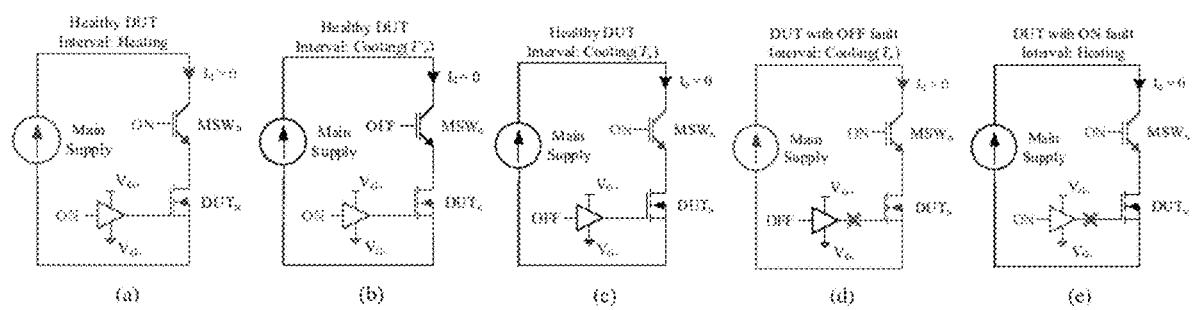
FIGs. 6a – e
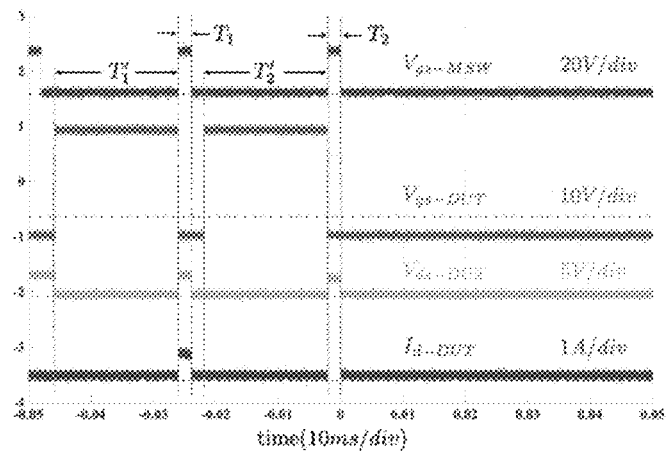
FIG. 7

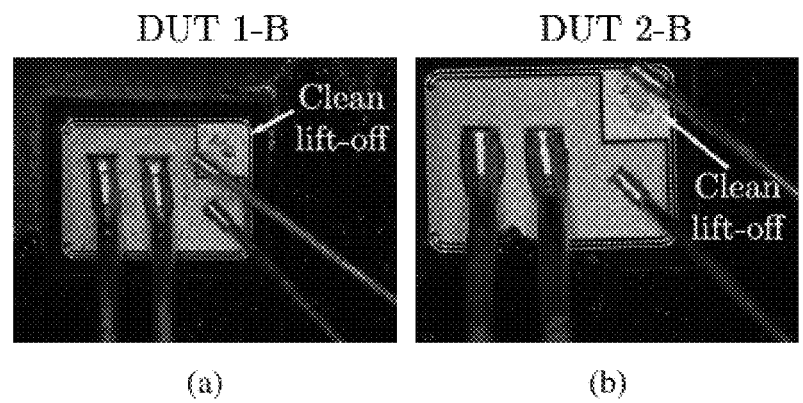
FIGs. 10a – b
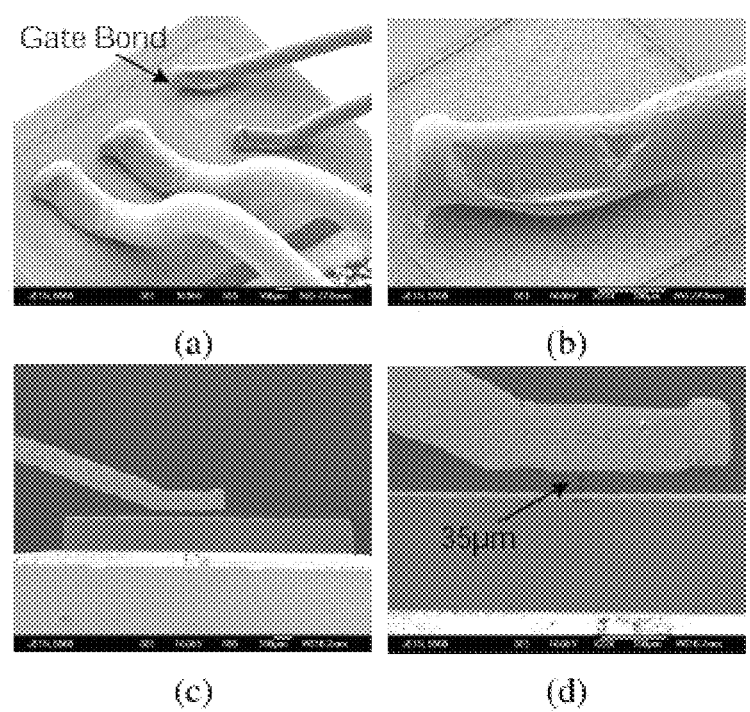
FIGs. 11a – d

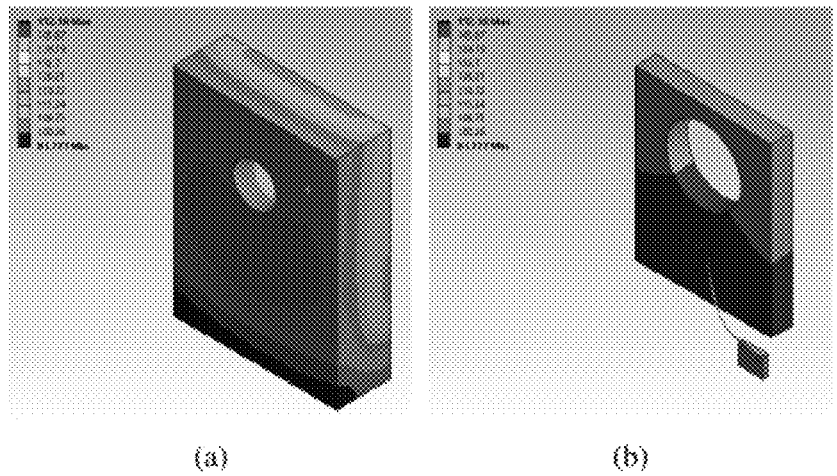
FIGs. 14a – b
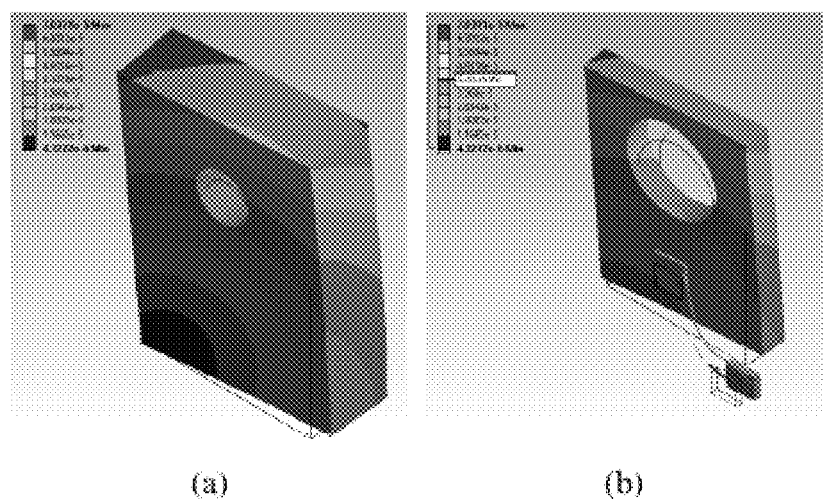
FIGs. 15a – b

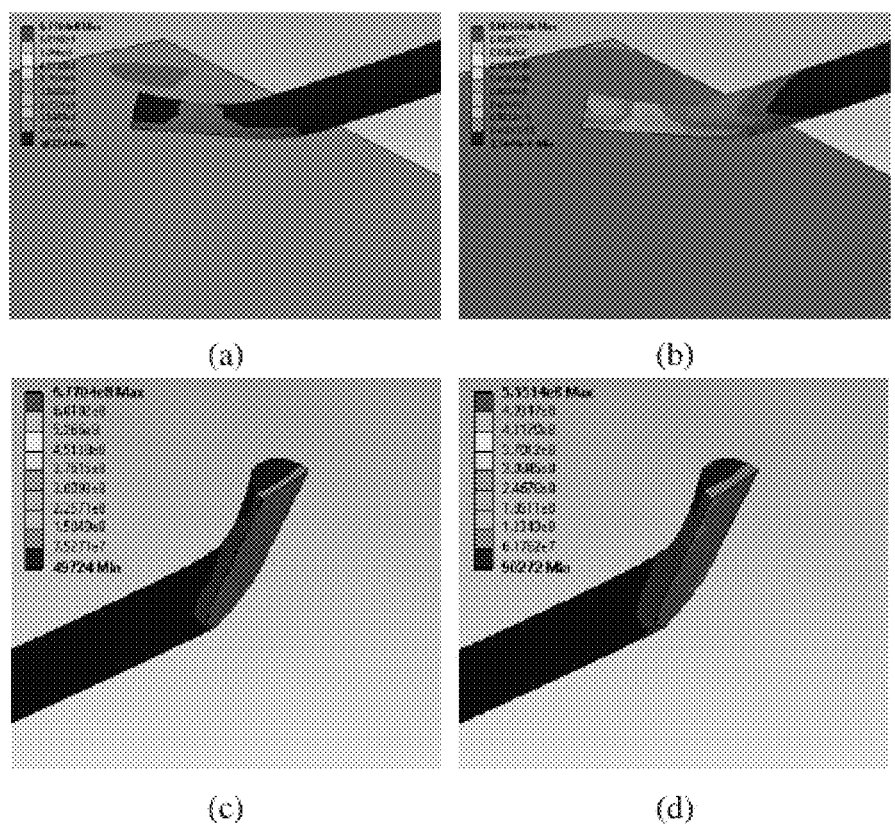
FIGs. 16a – d
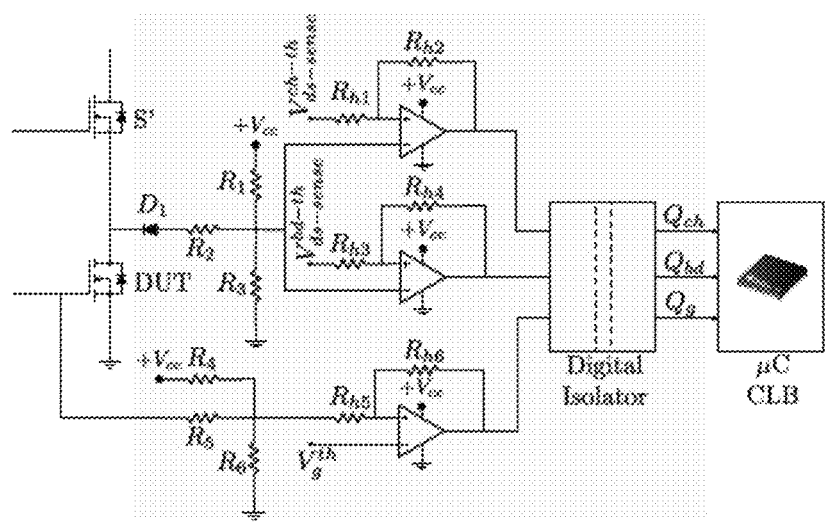
FIG. 17a

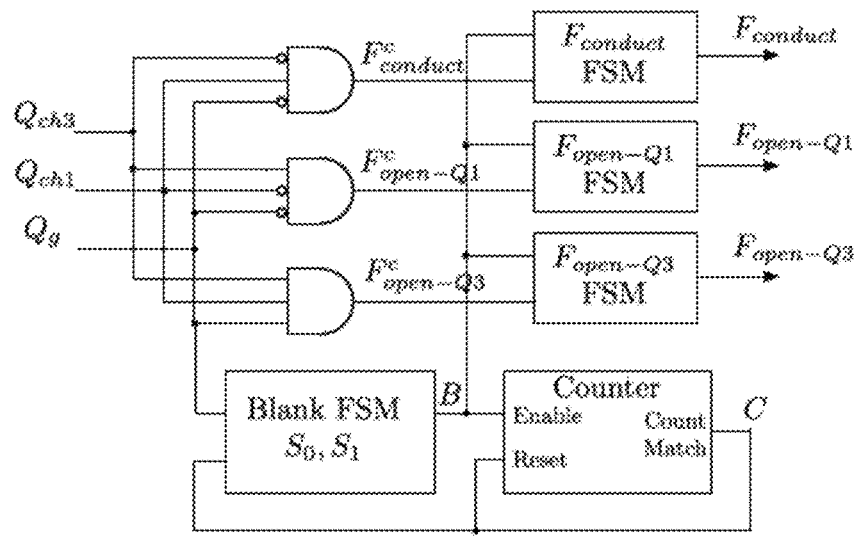
FIG. 19
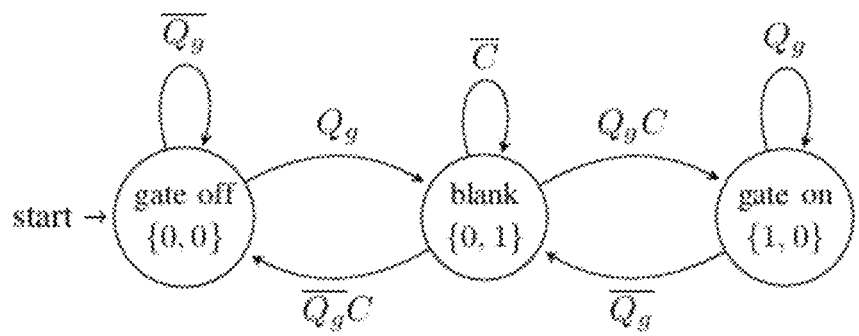
(a)
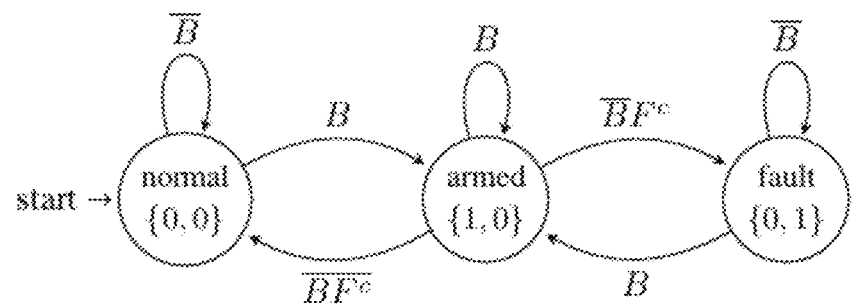
(b)
FIGs. 20a – b

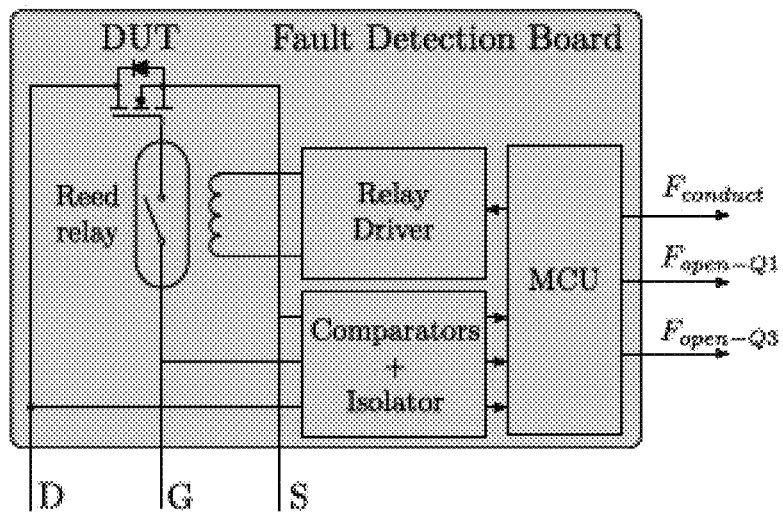
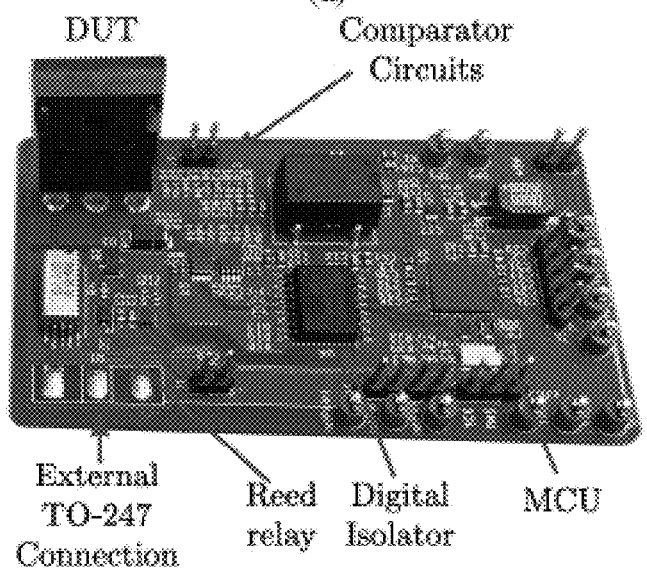
FIGs. 21a – b

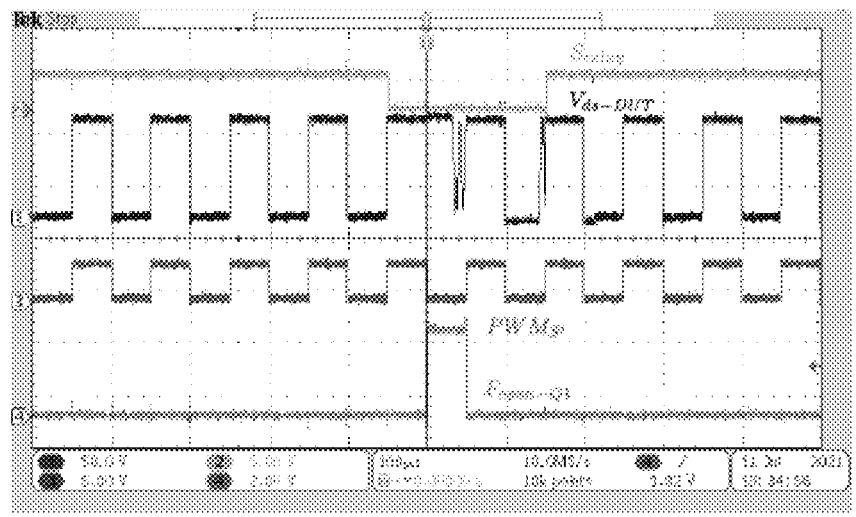
(a)
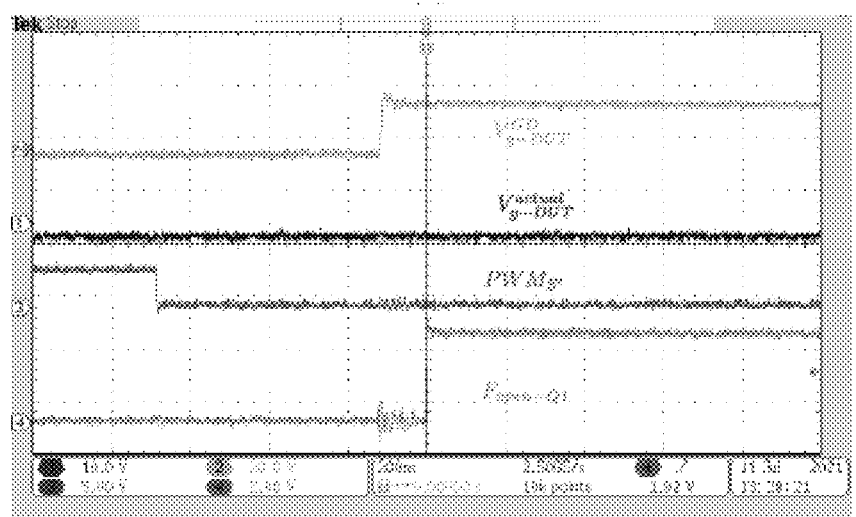
(b)
FIGs. 24a – b

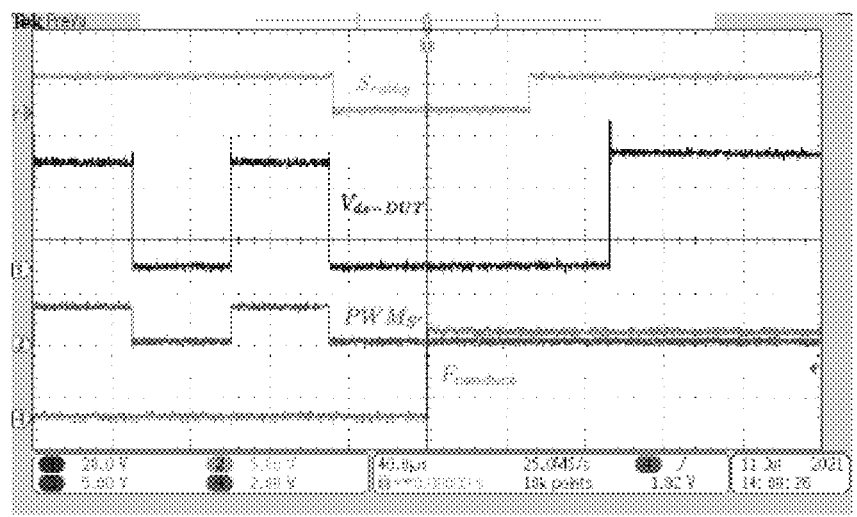
(a)
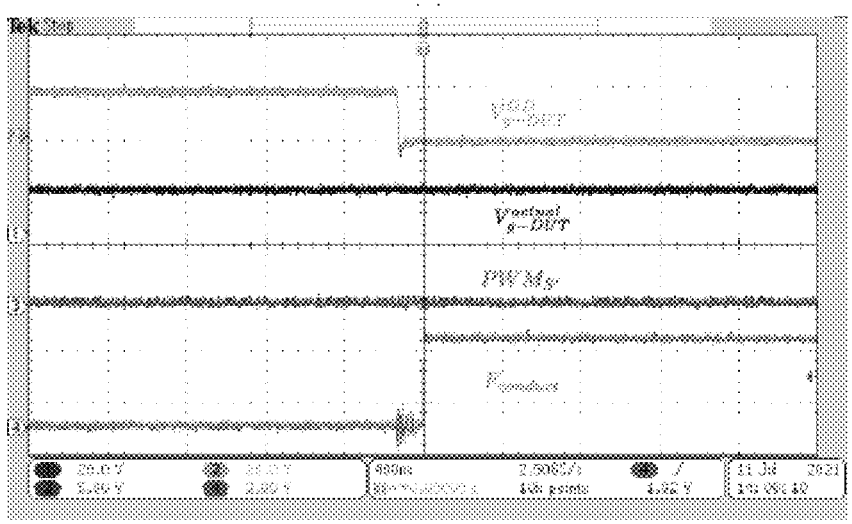
(b)
FIGs. 25a – b

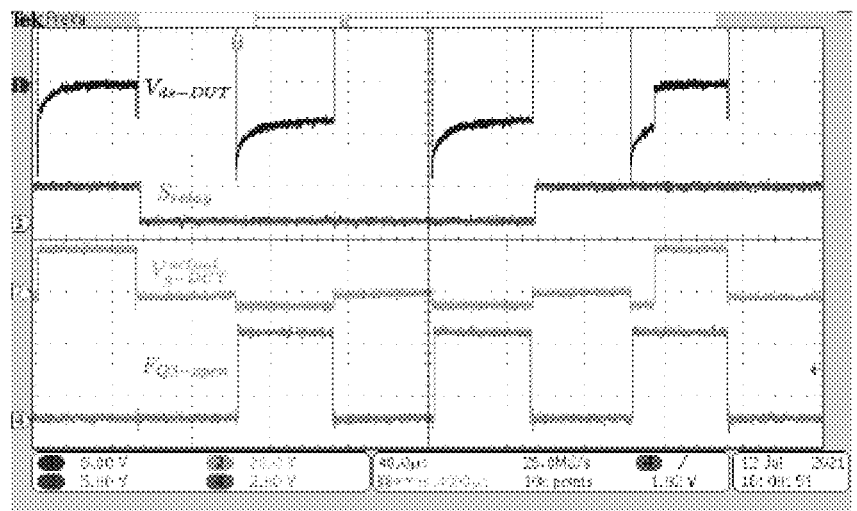
(a)
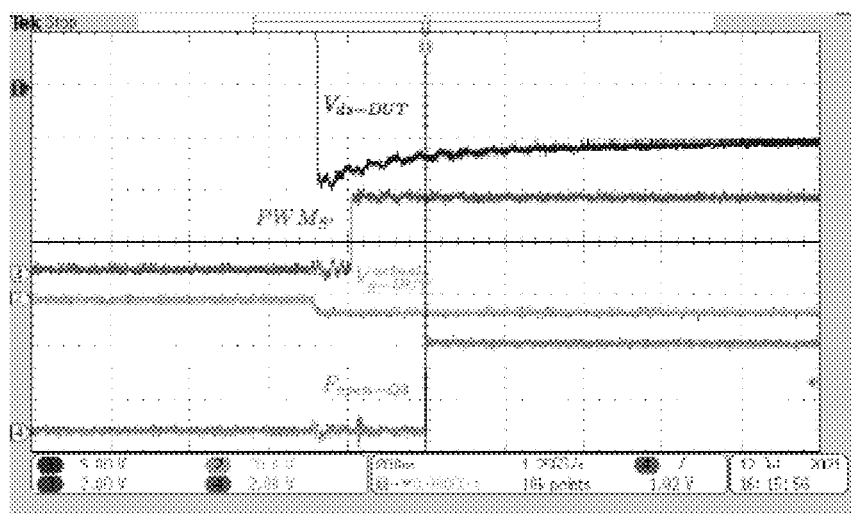
(b)
FIGs. 26a – b

US 11,585,844 B1

SYSTEMS, CIRCUITS, AND METHODS TO DETECT GATE-OPEN FAILURES IN MOS BASED INSULATED GATE TRANSISTORS

FIELD

The present invention relates to the field of electronics in general, and more particularly, to SiC power MOSFET devices.

BACKGROUND

Silicon Carbide (SiC) power MOSFETs are expected to enable a significant improvement in efficiency of power converters across different application areas. However, comprehensively understanding and improving their reliability remains an ongoing challenge. To this end, standard accelerated aging tests were often used to proactively test long term device reliability within a short duration. Among the standard tests, DC power cycling was widely used to accelerate package related aging mechanisms in power MOSFETs. Bond-wire heel cracking, bond-wire liftoff and die attach solder layer delamination were the common failure modes observed in this test. In addition to the above modes, power MOSFETs could also fail due to gate bond-wire liftoff or cracking leading to a gate-open failure. The consequent loss of gate control can lead to unwanted drain to source conduction, large increase in threshold voltage or open circuit failure of device.

BRIEF DESCRIPTION OF THE FIGURES

FIG. 3A is a circuit showing Parasitic capacitance in a MOSFET

FIG. 3B is a graph showing Cgd vs Vdg from the device datasheet.

FIGS. 4A-C are graphs of simulation waveforms under a conduction fault, a Q1 open fault, and an open fault, respectively.

FIGS. 5A-B is a DC Power Cycling schematic and a typical testing cycle using the circuit of FIG. 5A in some embodiments according to the invention.

FIGS. 6A-E are circuit schematics showing operation of a single leg of a DC power cycling test setup during A) heating interval for a healthy DUT; B) cooling T0n interval for a healthy DUT and C) cooling $T_n$ interval for a healthy DUT; D) cooling $T_n$ interval for a DUT showing OFF fault; and E) heating interval for a DUT with ON fault in some embodiments according to the invention.

FIG. 7 is a graph of an on-board characterization result for DUT showing intermittent OFF fault (Case 1) in some embodiments according to the invention.

FIGS. 10A-B are images of optical microscopy of A) DUT 1-B; B) DUT 2-B in some embodiments according to the invention.

FIGS. 11A-D are images of A) SEM image of decapsulated DUT die showing gate bond pad; B) close up image of gate bond pad showing gate bond lift-off; C) cross-sectional SEM of gate bond clearly showing a clean lift-off; and D) close up of gate bond showing a 35 μm lift-off height in some embodiments according to the invention.

FIGS. 14A-B are representations of temperature distribution across a device from transient thermal simulation for A) entire device and B) with EMC hidden in some embodiments according to the invention.

FIGS. 15A-B are representation of device deformation under heating for A) entire device and B) with EMC hidden Wireframe represents undeformed device in some embodiments according to the invention.

FIG. 16A-D are representations of A) Maximum shear stress; B) maximum elastic shear strain at the gate bond site with EMC and drain-tab hidden for CTEEMC=10 ppm/° C.; C) maximum shear stress at gate-bond wire for CTEEMC=10 ppm/° C.; and D) maximum shear stress at gate-bond wire for CTEEMC=5 ppm/° C. in some embodiments according to the invention.

FIG. 17A is a schematic representation of a gate failure detection circuit in some embodiments according to the invention.

FIG. 19 is a schematic logic circuit of CLB based fault detection logic in some embodiments according to the invention.

FIGS. 20A-B are state-transition diagrams for A) Blanking FSM and B) Fault FSM in some embodiments according to the invention.

FIGS. 21A-B are schematic of A) a gate-open failure detection circuit board and B) Actual prototype of the gate-open failure detection circuit board in some embodiments according to the invention.

FIGS. 24A-B are graphs of showing experimental verification of A) Q1 open fault detection and B) fault detection timing in some embodiments according to the invention.

FIGS. 25A-B are graphs showing experimental verification of A) conduction fault detection and B) conduction fault detection timing in some embodiments according to the invention.

FIGS. 26A-B are graphs showing experimental verification of A) Q3 open fault detection and B) fault detection timing in some embodiments according to the invention.

SUMMARY

Figure 1:
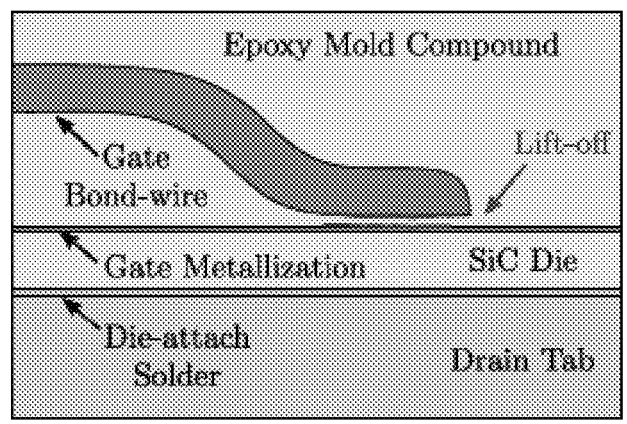
FIG. 1 is an illustration of gate-open failure in a discrete SiC MOSFET due to heel crack and bond-wire lift-off.

Embodiments according to the invention can provide systems, circuits, and methods to detect gate-open failures in MOS based insulated gate transistors. Pursuant to these embodiments, a system to detect gate-open failures in a MOS based insulated gate transistor can include a detection circuit, including a first circuit configured to measure a drain-source voltage across the MOS based insulated gate transistor, a first comparator circuit can be configured to compare the measured drain-source voltage to a threshold drain-source conduction voltage indicating a conduction state of a channel of the MOS based insulated gate transistor, a second circuit can be configured to measure a gate voltage applied at a gate of the MOS-based insulated gate transistor, a second comparator circuit can be configured to compare the gate voltage applied at the gate to a threshold gate voltage for the MOS based insulated gate transistor to provide an indication of whether the gate voltage applied at the gate is sufficient to activate conduction in the channel and a logic circuit can be configured to detect a gate-open failure of the MOS based insulated gate transistor based on the conduction state of the channel and the indication of whether the gate voltage applied at the gate is sufficient to activate conduction in the channel when the MOS based insulated gate transistor is in an on state or an off state.

DETAILED DESCRIPTION OF EMBODIMENTS ACCORDING TO THE INVENTION

Exemplary embodiments of the present disclosure are described in detail with reference to the accompanying drawings. The disclosure may, however, be exemplified in many different forms and should not be construed as being limited to the specific exemplary embodiments set forth herein. Rather, these exemplary embodiments are provided so that this disclosure will be thorough and complete, and will fully convey the scope of the disclosure to those skilled in the art.

As appreciated by the present inventors, gate-open failures in power semiconductors can occur when the gate-bond wire cracks or lifts-off leading to loss of gate control. In molded discrete devices, this failure mode may occur intermittently making it very challenging to analyze and detect. In some embodiments, a robust on-board technique for reliable cycle-by-cycle detection of gate-open faults was provided. The disclosed technique was experimentally verified for all fault scenarios and shown to detect faults in as low as 150 ns. Further, compared to traditional DESAT protection scheme, the disclosed mechanism can prevent potential shoot-through events that may be caused by gate-open failure.

As appreciated by the present inventors, SiC MOSFETs generally have a much smaller die and fundamentally different material properties than Si devices. Therefore, package related failure modes in Si devices should not be assumed to apply similarly to SiC devices. In particular, relatively thinner and longer gate bond wires due to smaller die and die placement can potentially increase SiC devices' susceptibility to gate-open failures. Moreover, the properties of the epoxy mold compound (EMC) material used in SiC MOSFETs need to be different to enable operation at higher temperature.

As appreciated by the present inventors, gate-open failures in discrete devices are often intermittent in nature. In a typical discrete SiC MOSFET, the die and gate bond-wire are encapsulated in epoxy mold compound (EMC) as shown in FIG. 1. In case of gate bond-wire liftoff, the EMC may hold the bond-wire to the pad and cause the contact to exist. However, during device operation, the relative displacement of various components in the package due to thermal changes can lead to intermittent gate contact. The device functions normally except during brief instances of loss of gate contact. Therefore, the intermittency of gate-open faults makes them very challenging to detect reliably. Given their elusive nature, comprehensive failure analysis of gate-open faults was also challenging. Undetected intermittent gate-open failures during DC power cycling tests can lead to incorrect device lifetime estimation. Moreover, in certain converter topologies, temporary disturbances caused by intermittent gate-open failures can be compensated by the control loop and potentially go undetected for a long time. For example, in synchronous converters, if a gate-open failure of the synchronous switch prevents it from turning on, the switch's body-diode starts conducting. Therefore, except a decrease in its efficiency, the converter appears to operate nominally.

To reliably detect gate-open failure during DC power cycling or converter operation, it was important to understand the electrical behavior of an SiC MOSFET under all possible gate-open failure scenarios. Therefore, as disclosed herein, the state of device's gate and channel under gate-open faults was comprehensively analyzed through SPICE simulations and analytical modelling. Further, the devices under test (DUTs) were aged using DC power cycling test. An on-board characterization technique was presented to detect gate-open failures during DC power cycling. Gate-open failure was detected in four of the DUTs. In order to verify the occurrence of gate-open failure in the failed devices, first, non-destructive acoustic microscopy analysis was performed to identify damage sites. Thereafter, the failed devices were carefully decapsulated and inspected through optical microscopy and scanning electron microscopy (SEM). To understand the mechanism behind gate-open failures, a thermo-mechanical finite element analysis (FEA) was performed on a high fidelity model of the DUT. It was shown that deformation caused by coefficient of thermal expansion (CTE) mismatch between various elements of the package causes interfacial shear stress in the gate bond. The stress was concentrated at the interface causing the gate bond wire to shear off. The simulations were repeated for two different properties of the EMC in order to analyze the impact of EMC's CTE on the gate bond stress. A robust on-board technique and circuits for cycle-by-cycle detection of gate-open failures is disclosed herein. Through experimental verification, it was shown that the disclosed technique can detect gate-open failure in as low as 150 ns. This enables the prevention of potentially catastrophic shoot-through events in a conduction type gate-open failure scenario. Furthermore, the disclosed technique can reliably detect gate-open failures in third quadrant operation which was not covered by conventional protection techniques.

I. Gate-Open Failure Analysis and on-Board Characterization

A. MOSFET's Behavior Under Various Gate-Open Failure Scenarios

Figure 2:
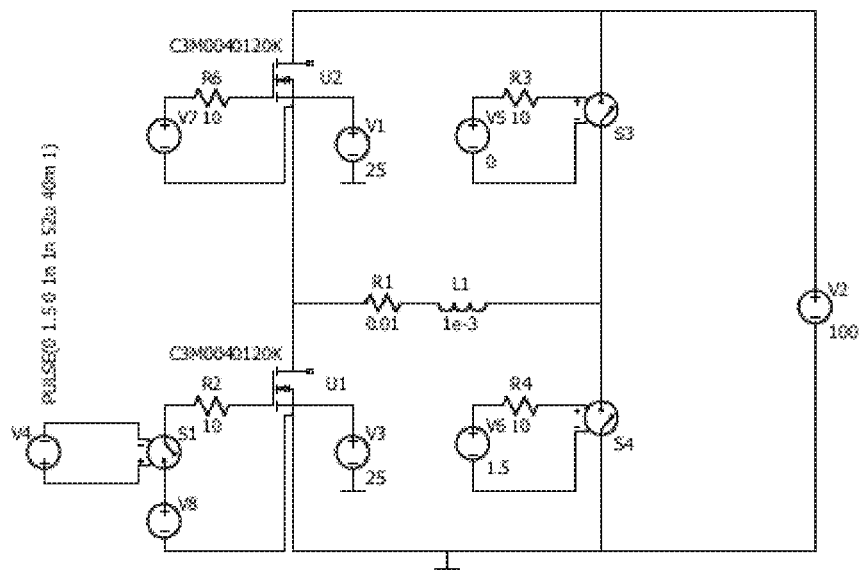
FIG. 2 is a SPICE simulation circuit for analysis of MOSFETs behavior under gate-open fault in some embodiments according to the invention.

Given the challenges in capturing intermittent gate-open failures, it was important to understand the electrical behavior of a SiC MOSFET under gate-open failure. For the purpose of this analysis, the circuit shown in FIG. 2 was simulated in LTspice. Manufacturer provided SPICE model was used for the DUT, U1. Gate-open fault was simulated by connecting an ideal switch S1 in the gate path of U1. The timing of the S1's opening was changed to simulate different gate-open failure scenarios. Furthermore, switches S3 and S4 are used to change the operational quadrant of the DUT. Specifically, when S3 was closed and S4 was open, U1 operates in the first quadrant (Q1) during its on interval. Similarly, when S4 was closed and S3 was open, U1 acts as the synchronous free-wheeling switch during its on interval and thus operates in the third quadrant (Q3).

FIG. 3a shows the electrical model of the DUT with parasitic capacitances. In case of a gate-open fault, the gate was electrically isolated and floating. Consequently, the charge on $C_{gd}$ and $C_{gs}$ was conserved. If the DUT's drain-source voltage after fault ($V_{ds}^f$) was different from before fault ($V_{ds}^{pf}$), the voltage across $C_{gs}$ and $C_{gd}$ changes correspondingly as given by (1)-(4). However, the charge on $C_{gd}$ and $C_{gs}$ changes by the same amount ($\Delta Q_f$) since it was conserved. DUT's $V_{gs}^f$ under fault, in this case, can be obtained using (5) where the relation between $\Delta Q_f$ and $V_{dg}$ was given by (6) since $C_{gd}$, unlike $C_{gs}$, was non-linear and a function of $V_{gd}$ as shown in FIG. 3b. The value of the integral can be obtained by calculating the corresponding area under the $C_{gd}$ vs $V_{gd}$ curve obtained from manufacturer's datasheet. In cases where $V_{dg}$ was large or $V_{dg} \leq 0$, $C_{gd}$ was nearly constant and can be approximated by (7). (6) then reduces to (8) and using (9), post fault $V_{gs}^f$ is given by (10). Moreover, when $V_{dg}$ was large, usually $C_{gd} \ll C_{gs}$. Therefore, (10) can be further approximated to (11). These equations are used in conjunction with the SPICE simulation results to understand the MOSFET's behavior under various gate-open fault scenarios as discussed further.

$$\Delta V_{ds} = V_{ds}^f - V_{ds}^{pf} \quad (1)$$

$$\Delta V_{dg} = -\left(V_{gd}^f - V_{gd}^{pf}\right) \quad (2)$$

$$\Delta V_{gs} = V_{gs}^f - V_{gs}^{pf} = \frac{\Delta Q_f}{C_{gs}} \quad (3)$$

$$\Delta V_{ds} = \Delta V_{dg} + \Delta V_{gs} \quad (4)$$

$$V_{gs}^f = V_{gs}^{pf} + \frac{\Delta Q_f}{C_{gs}} \quad (5)$$

where, $$\Delta Q_f = \int_{V_{dg}^{pf}}^{V_{dg}^f} C_{gd}(v_{dg}) dv \quad (6)$$

If $V_{dg}$ was large or $V_{dg} \leq 0$, $C_{gd}$ was almost constant. Then, $$C_{gd} = C_{gd}(V_{dg}^{pf}) = C_{gd}(V_{dg}^f) \quad (7)$$

$$\Delta Q_f = C_{gd} \Delta V_{dg} \quad (8)$$

$$\Delta V_{ds} = \Delta Q_f \left(\frac{1}{C_{gd}} + \frac{1}{C_{gs}}\right) \quad (9)$$

$$V_{gs}^f = V_{gs}^{pf} + \left(\frac{C_{gd}}{C_{gd} + C_{gs}}\right) \Delta V_{ds} \quad (10)$$

If $V_{dg}$ was large, $C_{gd} \ll C_{gs}$: $V_{gs}^f$ can be approximated to $$V_{gs}^f = V_{gs}^{pf} + \left(\frac{C_{gd}}{C_{gs}}\right) \Delta V_{ds} \quad (11)$$

1) Case 1—Conduction Fault: Firstly, gate-open failure event can occur when the DUT was on. As shown in FIG. 4a, this was mimicked by opening S1 when DUT was on. In the subsequent off period when gate driver voltage, $V_g^{GD}$ was low, the DUT's actual gate-voltage, $V_g^{actual}$ remains high. During this period, the shoot-through current in U1 starts rising as soon as U2 turns on. As shown, this causes $V_{ds}$ and thus $V_{dg}$ to increase. From (5) and (6), it was evident that $V_{gs}$ increases further. Due to SiC MOSFET's high transconductance, an increase in Vgs results in significant decrease in U1's on-state resistance thus preventing a further increase in Vds. From FIG. 4a, it was seen that $V_{ds}^f$=13.54V and $\Delta V_{ds}$=13.455V. Since, $V_{gs}^{pf} < V_{dg}^f < 0$, $C_{gd}$ can be assumed constant such that $C_{gd}$=1000 pF and $C_{gs}$=2900 pF. By using (10) and known $V_{gs}^{pf}$=15 V, $V_{gs}^f$ was calculated as $V_{gs}^f$=18:45V ($\Delta V_{gs}$=3.45 V). This was very close to experimentally observed value of 18:70V. Therefore, a conduction fault causes the gate voltage of the failed device to increase further and prevents it from turning off. Furthermore, this also causes unequal short-circuit energy dissipation between the high-side and low-side devices. Since majority of the power was dissipated in the complimentary high-side switch, it may be damaged if the fault was not isolated.

2) Case 2a—Open Fault in Q1 Operation: Alternatively, gate-open failure can occur when the U1 was off. The DUT gate voltage remains low in this case even in U1's on interval. Since U2 was off in this interval, the body-diode of U2 turns on to provide a free-wheeling path to inductor current ($I_{L1}$). As shown in FIG. 4b $\Delta V_{ds}$=4:13V which was equal to the forward voltage drop of U2's body-diode. Since $V_{ds}^f \approx V_{ds}^{pf}$=100V, Cgd can be assumed to be constant at $C_{gd}$=10 pF. From (11), $\Delta V_{gs}$=0:015V and $V_{gs}^f$=−4.985V which was very close to experimentally obtained value of −4.983V. Therefore, in case of an open type gate-open fault in Q1 operation, the DUT's gate voltage remains nearly constant and the device remains off. It was also seen from FIG. 4b that the inductor current was decaying due to U2's body-diode loss. Moreover, as the application voltage increases $\Delta V_s$ becomes increasingly insignificant.

3) Case 2b—Open Fault in Q3 operation: Lastly, an open type gate-open fault may occur when the device was operating in Q3. In such a case, the device experiences a gate-open fault when it was off as shown in FIG. 4c. When the device was subsequently turned on, the device's channel fails to turn on. However, since the device was operating in Q3, its body-diode starts conducting. $\Delta V_{ds}$ and $\Delta V_{dg}$ are negative. Consequently, from (5) and (6), the DUT's gate voltage decreases further. Since $V_{gs}^{pf}$ was negative, $V_{gs}^f$ becomes more negative as clearly seen in FIG. 4c. Obtaining $V_{gs}^f$ requires the solution of (6). In FIG. 3b, $V_{gs}^f$=100V and $V_{dg}^f$=2.1808V. By assuming $C_{gd}$ to be piece-wise exponential function in these intervals, the approximate value of $\Delta Q_f$ was obtained as $\Delta Q_f$=4149.36 nC. $V_{gs}^f$ thus calculated from (5) was $V_{gs}^f$=−6.43V. This was in close agreement with value obtained from simulation i.e. $V_{gs}^f$=−6.35V. Therefore, it can be concluded that under gate-open failure in Q3 operation, the DUT remains off with its gate voltage becoming more negative.

As described above, all three fault scenarios, the device's state gets latched when a gate-open fault occurs. Specifically for conduction type and Q3-open type fault scenarios, gate-open failure has a positive feedback effect on device's gate voltage. This implies that the device's operational state under fault was stable and does not slowly change over time. Similar behavior was also observed for Q1-open failure scenario. However, in this case although the fault has a negative feedback effect on gate-voltage, the magnitude was negligible. This understanding was essential in developing on-board gate-open failure detection technique. It was important to note, however, that due to its intermittent nature, a device with a particular gate-open fault type may temporarily recover and later show another fault type. For example, unless isolated, a device with open type fault may have temporary re-establishment of gate-contact due to bond-wire movement and then show a conduction fault.

B. DC Power Cycling Test Methodology

FIG. 5a shows the high level schematic of the DC power cycling test setup used. Each leg of the setup has one DUT and a main switch (MSW) in series. The main switch was used for safe fault detection and isolation. Multiple legs are connected in parallel across the main power supply. One leg was on at any given time, heating up corresponding DUT. As shown in FIG. 5b, when the DUT reaches its maximum junction temperature ($T_{j-max}$), it was turned off for cooling and the next DUT was turned on. The cycles were repeated till device failure. This setup allows independent control of $\Delta T_j$ of each DUT.

A total of 8 devices, in two groups of 4 were tested under two different $\Delta T_j$ conditions. Of these, 2 devices in each batch were detected with gate-open failure as shown in Table I.

TABLE 1

DC Power Cycling Test Results

| DUT No. | $T_j$ Swing | $T_j$ Mean | $\Delta T_j$ | Cycles to Failare($N_f$) |
|---|---|---|---|---|
| DUT1-A | 55° C.-150° C. | 102.5° C. | 95° C. | 6000 |
| DUT1-B | 55° C.-150° C. | 102.5° C. | 95° C. | 7200 |
| DUT2-A | 35° C.-150° C. | 92.5° C. | 115° C. | 8000 |
| DUT2-B | 35° C.-150° C. | 92.5° C. | 115° C. | 7800 |

The devices used were 1000V, 22 A SiC MOSFET in TO-247-4 package was selected for this study. The table also shows the recorded cycles to failure ($N_f$) corresponding to each of the devices. Here, failure was defined as the first detection of gate-open fault. Comprehensive failure analysis of these devices was discussed further.

C. On-Board Failure Characterization

1) On-board failure characterization technique: Based on understanding of electrical behavior of devices with intermittent gate-open failure, an on-board failure characterization technique as disclosed herein. FIG. 6 shows the operation of the DC power cycling setup. During heating period, as shown in FIG. 6(a), both MSW and the DUT are on. Therefore, the DUT drain current, $I_{d\text{-}DUT}$>0. However, during DUT cooling period, the DUT and MSW are turned on alternatively during intervals labeled as $T_n'$ (FIG. 6(b)) and $T_n$ (FIG. 6(c)). In this study, $T_n'\approx20$ ms and $T_n\approx2$ ms were selected. This process was repeated throughout the DUT cooling period. For a healthy DUT, $I_{d\text{-}DUT}=0$ during $T_n'$ and $T_n$.

In case of a conduction type gate-open fault, since the DUT fails to turn-off, $I_{d\text{-}DUT}$>0 during the interval $T_n$ as shown in FIG. 6(d). The on-board controller of the DC power cycling test bench detects this current and identifies the fault. $T_n'$ interval was necessary to charge the DUT gate to check for intermittent failure. Specifically, the disclosed technique verifies the gate function of the DUT by repeatedly charging and discharging the DUT gate. In case the gate contact was temporarily lost, the DUT gate fails to discharge and shows a conduction fault. The MSW isolates the DUT during the testing process. However, in this setup, the DUT can be checked for open fault only at the beginning of heating period as shown in FIG. 6(e). If $I_{d\text{-}DUT}=0$ when both DUT and MSW were turned on, it implies the DUT has an open fault. Moreover, since the DUT does not operate in Q3 in DC power cycling, it was not checked for. Failure conditions for on-board fault characterization of gate-open faults are summarized in Table II.

TABLE II

Failure Conditions for On-board Gate-open Fault Characterization

| Interval | MSW Status | DUT GD Status | Expected Condition | Observed Condition | Fault Type |
|---|---|---|---|---|---|
| Cooling ($T_n$) | On | Off | $I_d = 0$ | $I_d > 0$ | Q1 Conduction Fault |
| Heating | On | On | $I_d > 0$ | $I_d = 0$ | Q1 Open Fault |

Figure 8:
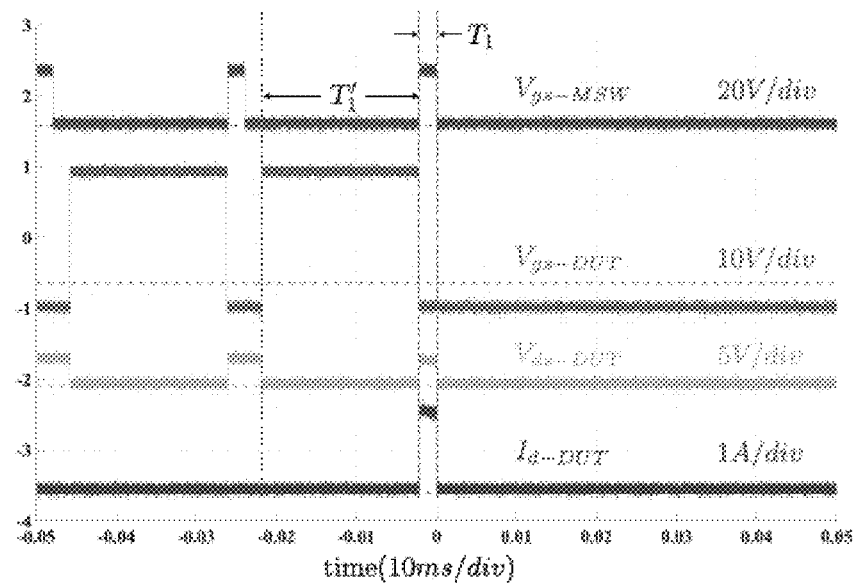
FIG. 8 is a graph of an On-board characterization result for DUT showing intermittent OFF fault (Case 2) in some embodiments according to the invention.

2) Results of on-board characterization: The result from onboard characterization study of DUT 1-A experiencing intermittent gate-open failure during DC power cycling was shown in FIG. 7. As observed, during intervals $T_1$ and $T_2$ when DUT was off and MSW was on, a current was flowing through the DUT indicating a conduction fault. It must be noted, however, that the magnitude of current in interval $T_1$ was ~0.5 A whereas in $T_2$ it was ~4 A. In fact, current probe setting for detecting the small current in $T_1$ leads to probe saturation at high current during $T_2$, making the current peak unclear. It implies that drain to source impedance during $T_1$ was high whereas the channel was fully open during $T_2$. Also, no current was observed before the interval $T_1$. This clearly shows that the gate-open failure in this case was intermittent in nature. Moreover, the significant decrease in drain source resistance during T2 compared to $T_1$ could be because of a temporary gate contact during $T_2'$ when the DUT was on. FIG. 8 shows scope result of another on-board characterization study of a failed DUT. In this case, conduction fault was observed in interval $T_1$ prior to which the device appears to be healthy, again highlighting the intermittency of the fault. During $T_1$, the current through the DUT was ~3.5 A. It must be noted that the DUT was tested for failure during its cooling interval when another DUT was heating up. Therefore, in case of conduction fault, approximately half of the main power supply current flows through the failed DUT. Since the main power supply current setting for this test was 7 A, it implies that the failed DUT's channel was fully on. Therefore, it can concluded that the gate-open failure occurred when the DUT was on during $T_1'$. In this case, since the gate was fully charged, a gate-open failure during $T_1'$ interval leads to DUT staying on during $T_1$.

II. Detailed Failure Analysis

A. Non-Destructive C-SAM Analysis

Figures 9A, 9B, 9C, 9D, 9E, 9F:
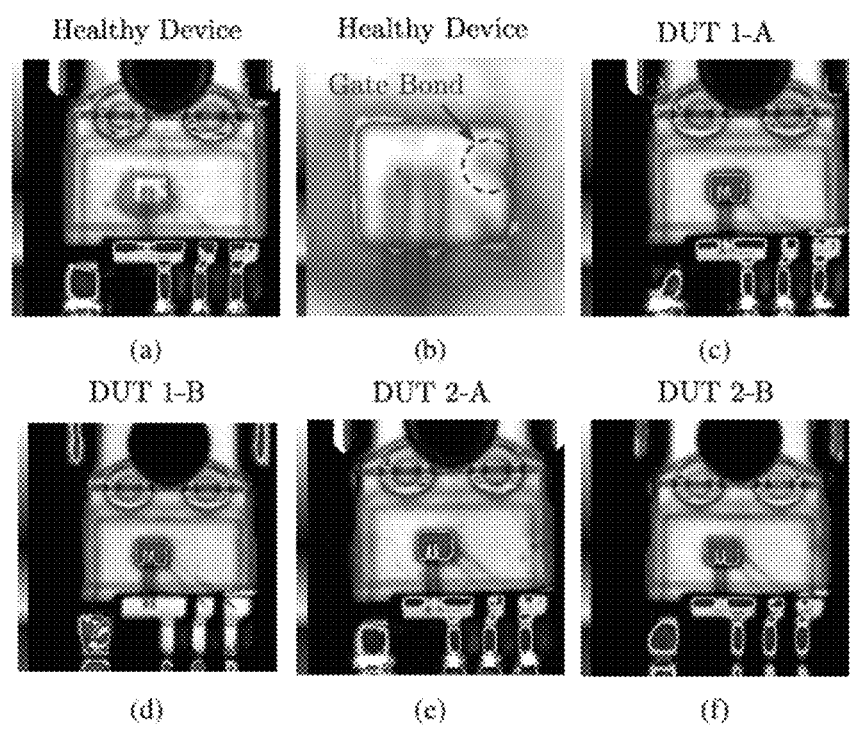
FIGS. 9A-F show C-SAM images of A) healthy device; B) close-up of healthy device die; C) DUT 1-A; D) DUT 1-B; E) DUT 2-A; F) DUT 2-B in some embodiments according to the invention.

After on-board characterization, non-destructive failure analysis was performed on the failed DUTs using confocal scanning acoustic microscopy (C-SAM) to verify the occurrence of gate-open failure mechanism in the failed devices. FIGS. 9a and 9b show C-SAM images of a healthy device. The red and yellow areas inside the package represent delamination sites. It was seen that there was almost no delamination in a healthy device package. Gate bond pad area was indicated in FIG. 9b which does not show any delamination either. However, the C-SAM images of all the failed DUTs show delamination over the entire die area as seen in FIGS. 9c to 9f. The delamination sites indicate that the mold compound above the die has moved relative to the die. The relative motion between the die and mold compound can exert shear forces on the gate bond-wire causing it to lift-off. This also provides possible explanation for intermittency of the failure. During DC power cycling, as the device heats up and cools down, the mold compound expands and contracts relative to the die, thereby moving the gate bond-wire. Therefore, during these intervals, the gate bond-wire can temporarily have instances of sufficient contact with the gate bond-pad on the die, causing the device to function normally.

B. Optical Microscopy

The failed DUTs were carefully decapsulated to verify the gate-open failure hypothesis. FIGS. 10a and 10b show the images of the DUTs 1-B and 2-B obtained using an optical microscope. The devices were inspected under 1000× magnification. As indicated on the top-right corner of each image, the gate-bond wires clearly show clean liftoff from the gate bond-pad. The power source and kelvin source connections, on the other hand, appear normal. This conclusively proves gate-open failure in these devices.

C. Cross-Sectioning and SEM Analysis

Figure 12:
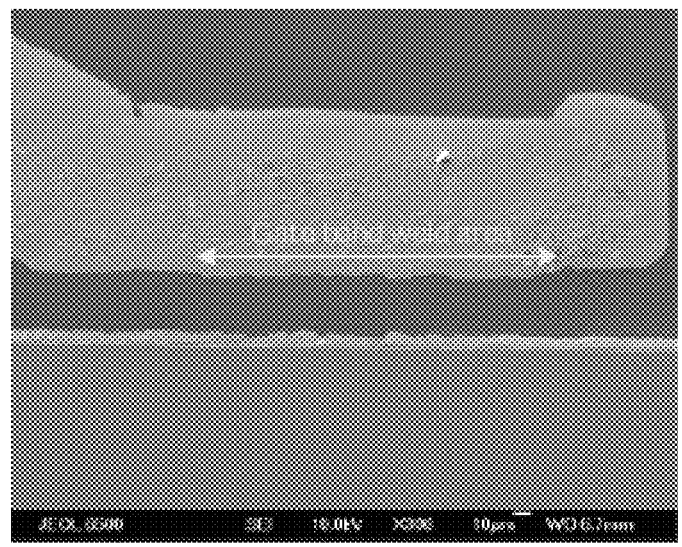
FIG. 12 is a cross-sectional SEM image of gate bond in some embodiments according to the invention.

To further investigate gate-open failure, DUT 1-A was carefully decapsulated and inspected using scanning electron microscopy (SEM). FIG. 11a shows the SEM image of the exposed DUT die. The close-up image of the gate bond site was shown in FIG. 11b. It was clearly seen that the gate bond-wire was slightly lifted off the gate bond pad. Further, the device was carefully encapsulated using a low viscosity epoxy resin. This prevents the movement of gate bond wire due to the flow of the resin during encapsulation. Thereafter, the encapsulated device was smoothly ground parallel to the gate bond wire plane. Further SEM inspection of the device clearly indicates a clean lift-off of the gate bond-wire as shown in FIG. 11c. The close-up of the gate bond in FIG. 11d shows that the bond-wire was lifted-off by ~35 µm. It must be noted that before investigation, the DUT showed drain-source open failure without any recovery to normal operation. FIG. 12 shows a highly magnified SEM image of the gate site. The gate bond weld area was indicated in the figure. From the roughness observed on the gate-bond pad under the weld area, it can be deduced that the separation occurs in the bulk of the gate bond-wire. This type of lift-off was typically caused by interfacial shear stress in the gate-bond.

D. FEA Analysis of Gate-Bond Failure Mechanism

Figure 13:
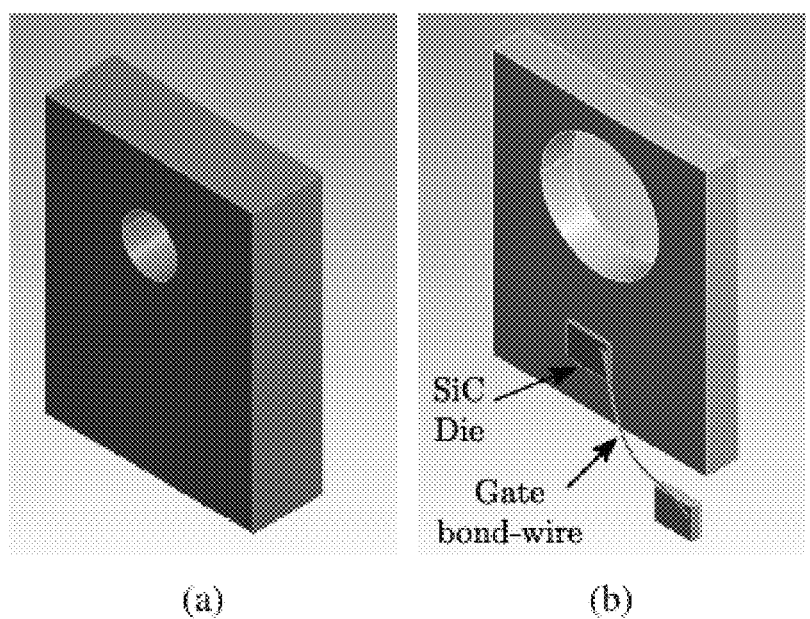
FIG. 13 is a representation of a device model for FEA analysis a) entire model; b) with EMC hidden in some embodiments according to the invention.

In order to explain the potential mechanism for gate bond-wire liftoff in SiC MOSFETs observed during DC power cycling, a thermo-mechanical FEA analysis was performed in ANSYS, the results of which are discussed here. First, a high fidelity model of the DUT was developed as shown in FIGS. 13a and 13b. The external dimensions were obtained from manufacturer datasheet. Gate bond-wire diameter and aspect ratio was obtained by combining information from C-SAM images, optical microscopy of decapsulated, cross sectioned devices and SEM images. To simplify the analysis, only internal gate lead and gate-bond wire were modelled. The source, drain leads and source bond-wires were ignored as they do not have significant thermal or mechanical implications on gate-bond itself. Furthermore, generally known properties for materials like copper, aluminum and SiC were chosen. This gives fairly accurate results since properties of these materials do not vary widely for the given application. For each property a representative value from known range of values for EMC used in power semiconductor applications was chosen. The chosen material properties are listed in Table III.

TABLE III

Material Properties Used for FEA Simulation

| Element | Material | Density (kg/m$^3$) | CTE (ppm/° C.) | Young's Modulus (GPa) |
|---|---|---|---|---|
| Drains tab, Gate lead | Copper | 8300 | 18 | 110 |
| Gate bond-wire | Aluminium | 2770 | 23 | 71 |
| EMC | — | 1780 | 10 | 30 |
| Die | SiC | 3100 | 2.75 | 400 |

In the first step, a transient thermal simulation was performed to obtain device's temperature data at the end of the heating interval. For this, the SiC die was configured as an internal heat source, the value of which was set as the calculated DUT power loss during DC power cycling test. Since the DUT was only cooled by natural air convection cooling, a convection coefficient was set for the entire external surface of the device. The simulation was run for 50 s and results obtained are shown in FIGS. 14a and 14b. It was seen that the maximum temperature of 152.16° C. was in close agreement with experimental data.

The temperature data obtained from transient thermal simulation was used to perform static structural analysis. For structural analysis, two adjacent corners at the bottom of the device are translationally constrained in all three directions. However, the rotational axes are free to allow warping and deformation. This was similar to the condition when device leads were soldered to the PCB. The physical deformation in the device due to heating was shown in FIGS. 15a and 15b. The deformation factor was exaggerated to clearly show warping of the package. The resulting shear stress on the gate wire-bond was seen in FIG. 16a. It was seen that the bond-wire experiences shear stress at the gate bond interface. This was consistent with bond-wire liftoff mechanism as observed in the analysis of failed devices. In FIG. 13a, the resulting interfacial shear strain was shown. The strain was relatively high in the bond wire since aluminum, which was the bond-wire material, has a much lower elastic modulus than SiC which was relatively hard. This can result in fatigue occurring in the bulk of the bond wire which was consistent with the observation in FIG. 12. The effect of EMC's properties on the shear stress in the gate bond was studied by varying the EMC's CTE as shown in FIGS. 16c and 16d. The probed maximum shear stress for EMC $CTE_{EMC}=10_{ppm}$/° C. was 134.12M Pa whereas it was 139.46M Pa for the case when $CTE_{EMC}=5$ ppm/° C. Since the deformation mainly occurs due to CTE mismatch between EMC and the copper drain tab whose $CTE_{Cu}=18$ ppm/° C., the larger CTE mismatch in the case when $CTE_{EMC}=5$ ppm/° C. causes greater deformation and thus causes greater shear stress in the gate-bond interface. This was also shows that the shear stress in the gate bond interface was a function of the EMC property. This was crucial because of two complimentary reasons. First, due to the relatively smaller size of SiC die, the gate-bond wire itself was thinner compared to traditional Si devices. This reduces the overall gate bond strength and critical shear stress becomes lower. Secondly, due to the relatively higher operating temperatures of SiC devices, the thermo-mechanical properties of EMC used for SiC devices are different.

Therefore, it was crucial to consider the effect of EMC's properties on device warping and thus the possibility of gate wire-bond lift-off.

III. On-Board Detection of Gate-Open Failure

A. On-Board Detection Circuit

1) Detection Circuit: FIG. 17A shows the schematic of the disclosed gate-open failure detection circuit. The DUT was represented by the low-side MOSFET and S' was the complimentary high-side switch. The detection circuit comprises of two resistor sensing networks. The first network consisting of resistors $R_1$, $R_2$, $R_3$ and $D_1$ was used to measure the drain-source voltage across the DUT ($V_{ds\text{-}DUT}$). D1 blocks the high off-state voltage across the device. By choosing appropriate values of $R_1$, $R_2$, $R_3$, it can be ensured that the output of the $V_{ds\text{-}DUT}$ sensing network ($V_{ds\text{-}sense}$) was always positive for both positive and negative values of $V_{ds\text{-}DUT}$. This allows the comparators to be operated with single-ended supply derived from the gate-driver's supply voltage thus making the design simpler. $R_4$, $R_5$ and $R_6$ form the second network that was used to sense the DUT's gate voltage ($V_{g\text{-}DUT}$). In this case as well, the appropriate choice of resistor values ensures that the sensed gate voltage ($V_{gs\text{-}sense}$) was positive even for bipolar gate operation as was common in high-power SiC applications. The relation between $V_{ds\text{-}DUT}$, $V_{gs\text{-}DUT}$ and $V_{ds\text{-}sense}$, $V_{gs\text{-}sense}$ was given by (20)-(21) and (22) respectively. The output of the $V_{ds\text{-}DUT}$ sensing network was connected to the inverting inputs of comparators $U_{ch}$ and $U_{bd}$. The non-inverting inputs of the comparators are fixed threshold values $V_{ds\text{-}sense}^{ch\text{-}th}$ and $V_{ds\text{-}sense}^{bd\text{-}th}$ respectively. A third comparator, $U_g$ was used to detect the state of applied gate voltage. The inverting and non-inverting inputs of this comparator are connected to $V_{gs}^{th}$ and $V_{gs\text{-}sense}$ respectively. The outputs of all the comparators are passed to the MCU through a digital isolator. The digital isolator ensures galvanic isolation between power and logic side grounds. Also since the disclosed circuit relies on gate drive power supply, it can be used with both high-side and low-side switch configurations.

Figure 18:
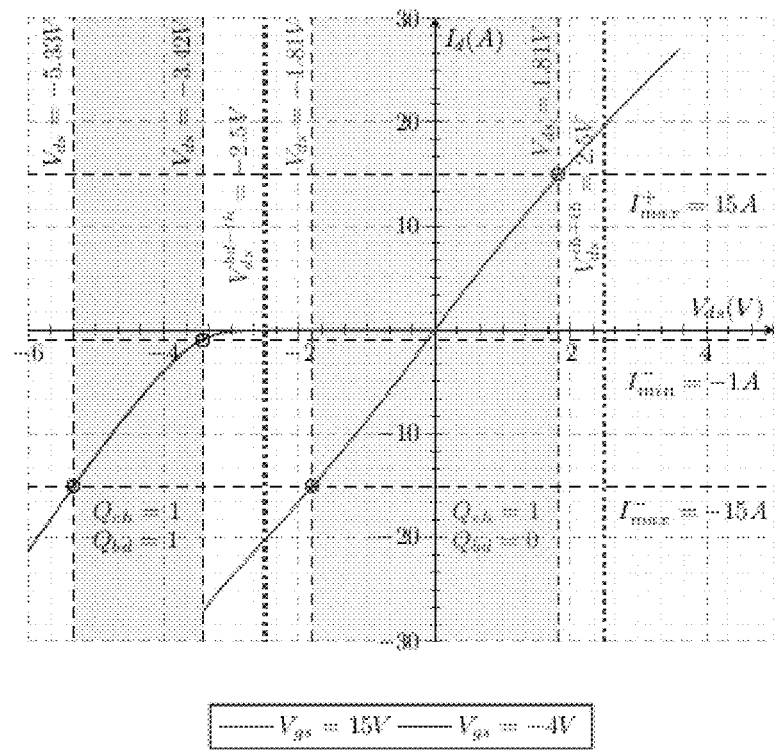
FIG. 18 is a graph of device operating points on the output curve to analyze choice of detection circuit threshold parameters in some embodiments according to the invention.
Figure 22:
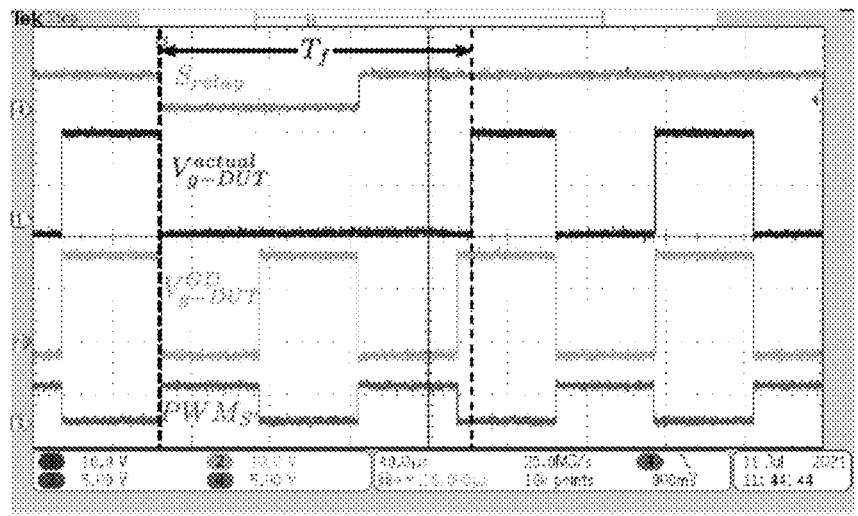
FIG. 22 is a graph of a verification of a fault emulation technique in some embodiments according to the invention.

2) Principle of Operation: The objective of using the detection circuit was to accurately identify the DUT's state of operation. More specifically, the detection circuit identifies the conduction state of the DUT's channel and the state of the applied gate voltage by sensing $V_{ds\text{-}DUT}$ and $V_{gs\text{-}DUT}$ respectively. To illustrate the operation of the disclosed detection circuit, a commercial SiC MOSFET was considered as the DUT. The output V-I curve of the device for $V_{gs}$=15V and Vgs=−4V at junction temperature, $T_j$=55° C. was plotted in FIG. 18. The plots were obtained by using the manufacturer provided SPICE model. As shown, for an application with a maximum instantaneous current $I_{max}^+$=15 A, the device's $V_{ds}$=1.81V. Due to MOSFET's symmetrical structure, the DUT's channel conducts for Q3 operation as well. Consequently, for $I_{max}^-$=−15 A, $V_{ds}$=−1.81V. Therefore, for the given application when −1.81V≤$V_{ds}$≤1.81V, it can be safely concluded that the device's channel was conducting. Choosing $V_{ds}^{ch\text{-}th}$=2.5V ensures that when the device channel was conducting, the output of comparator $U_{ch}$ was high and thus $Q_{ch}$=1. However, in this case, $Q_{ch}$=1 even when $V_{ds}$<−1.81V. This was possible when the device channel was off, and the body-diode conducts during Q3 operation. Therefore, additional information was required to determine the state of the device channel during Q3 operation. For this reason, a second comparator $U_{bd}$ was used. As seen from FIG. 18, for the given application, the body-diode forward voltage drop varies between −3.42V to −5.33V depending on the instantaneous current value. Therefore, if as $V_{ds}^{bd\text{-}th}$=−2.5V, the output of $U_{bd}$ and thus $Q_{bd}$ gives the state of body-diode conduction. In summary, the digital outputs $Q_{ch}$ and $Q_{bd}$ provide complete information about the state of the device channel and body-diode. Furthermore, the output of comparator $U_g$ corresponds to the applied gate voltage. $Q_g$=1 when $V_g$ was high and vice-versa. To ensure accurate fault detection, the thresholds must be carefully chosen depending on device's operating points in Q1 and Q3 for the particular application.

Figure 17B:
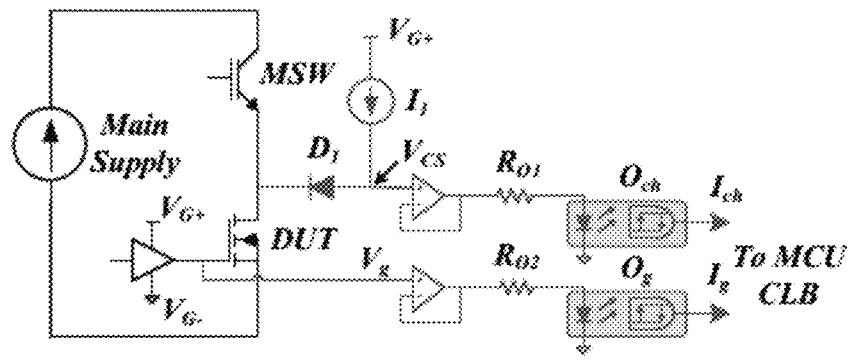
FIG. 17B is a schematic representation of a gate fault detection circuit utilize a current source circuit in some embodiments according to the invention.

FIG. 17b shows a schematic of a gate-open failure detection circuit including a current source in some embodiments according to the present invention. As previously discussed, the DC power cycling setup has a main switch and the DUT connected in series across the main power supply. As shown, the detection circuit comprises a current source $I_1$ which is connected such that it injects a small current through the DUT when the DUT channel was on. A diode $D_1$ was also present to prevent reverse current flow into $I_1$. The current source was supplied by the DUT gate driver supply thus eliminating the need for additional power supplies. The voltage at the output of the current source ($V_{CS}$) was passed through a unity gain buffer which drives the input of a logic output optocoupler $O_{ch}$. Similarly, the gate voltage of the DUT also drives another optocoupler input through a unity gain buffer.

When the DUT was on, the current passes through the DUT channel and $V_{CS\text{-}ON}$=$V_{DS}$+$V_{D1}$, where $V_{DS}$ was the voltage drop across DUT and $V_{D1}$ was the forward voltage drop of $D_1$. When the DUT was off, there was no path for the injected current to flow therefore, there was negligible voltage drop across $I_1$. Therefore, $V_{CS\text{-}OFF}$≈$V_{G+}$, where $V_{G+}$ was the positive gate supply voltage which was 15V for this experiment. Further, under practical scenarios $V_{CS\text{-}ON}$<<$V_{CS\text{-}OFF}$. An appropriate value for the resistor $R_{O1}$ was chosen such that the output of $O_{ch}$ was high when the DUT was off and vice-versa. Similarly, the output of $O_g$ corresponds to DUT gate input.

B. Failure Detection Logic

The outputs of the previously discussed detection circuit were connected to a microcontroller (MCU) for processing. The MCU used in this study was a Texas Instruments TMS320F280041C with a configurable logic block (CLB). A CLB was an MCU peripheral that was functionally similar to an FPGA or CPLD. Therefore, using CLB allows hardware level logic signal processing instead of software like in a typical MCU. This makes failure detection independent of main control algorithm and eliminates any related overhead while allowing the failure detection logic to internally and quickly trip PWM outputs. The failure detection logic was implemented using combinational look up table (LUT) elements and finite state machines (FSMs). The details of the implementation are discussed further.

FIG. 19 shows the high-level schematic of the disclosed fault detection logic. The fundamental idea of the failure detection logic was to check for inconsistency between the DUT's gate and channel operation. As previously discussed, gate-open failure leads to a loss of control over device's conduction state. Therefore, tracking the device state during a gate transition event can allow detection of a gate-open failure. For the disclosed detection circuit, the state-of-health of the DUT corresponding to different combinations of the comparator outputs Qch, Qbd and Qg was shown in Table IV.

TABLE IV

Fault Identification Table

| $Q_{ch}$ | $Q_{bd}$ | $Q_g$ | Device state-of-health | Combinational fault logic |
|---|---|---|---|---|
| 0 | 0 | 0 | No conduction | |
| 0 | 0 | 1 | Open fault $F_{open-Q1}{}^c$ | $\overline{Q_{ch}}\overline{Q_{bd}}Q_g$ |
| 0 | 1 | 0 | Invalid | |
| 0 | 1 | 1 | Invalid | |
| 1 | 0 | 0 | Q1 conduction fault ($F_{conduct}{}^c$) | $Q_{ch}\overline{Q_{bd}}\overline{Q_g}$ |
| 1 | 0 | 1 | Q1/Q3 Channel conduction | |
| 1 | 1 | 0 | Q3 Body-diode conduction | |
| 1 | 1 | 1 | Q3 Open fault ($F_{open-Q3}{}^c$) | $Q_{ch}Q_{bd}Q_g$ |

Combinational fault signals ($F_{conduct}{}^c$, $F_{open-Q1}{}^c$ and $F_{open-Q3}{}^c$) corresponding to each type of fault can be obtained using logic gates. However, merely using combinational signals for detecting gate-open failure may lead to false positives. Delays associated with device switching and signal propagation during transition events may appear as momentary inconsistency in device operation. Therefore, it was important to differentiate between true failures and false positives while minimizing the fault detection time. For this reason, a blanking logic was implemented using a 4-state FSM and a counter. The state transition diagram for the blanking FSM was shown in FIG. 20a. When the gate input, $Q_g$, changes, the blanking FSM transitions to a blank state and sets the corresponding output B high. This event also starts a counter that counts to a preset blanking value. Upon reaching the preset value, a match output (C) was set high by the counter. C then transitions the blanking FSM out of blank state i.e, B becomes low and also resets the counter. By adjusting the count value, blanking window can be modified as per application requirement. The blanking FSM automatically provides input hysteresis within the blanking time window thus making the logic immune to noise related transition events. In addition to the blanking FSM, 4-state FSMs were also used for each of the fault outputs. Every fault FSM has two inputs the corresponding combinational fault signal ($F_x{}^c$) and the blank signal B. A transition on B 'arms' the fault FSM. At the end of the blanking window, when B goes low, the fault FSM either transitions to a normal state or a fault state depending on the value of the corresponding ($F_x{}^c$). The fault output remains latched until the next gate transition event. This logic enables cycle-by-cycle fault detection and provides reset capability. The state equations for blanking FSM and fault FSM are given in (23)-(25) and (26)-(28) respectively.

$$S_{0-next}=\overline{S_0}S_1Q_gQ_c+S_0\overline{S_1}Q_g \quad (15)$$

$$S_{1-next}=\overline{S_0}\overline{S_1}Q_g+\overline{S_0}S_1\overline{Q_c}+S_0\overline{S_1}Q_g \quad (16)$$

$$B=S_1 \quad (17)$$

$$S_{0-next}=(\overline{S_0}+\overline{S_1})B \quad (18)$$

$$S_{1-next}=(\overline{S_0}S_1+S_0\overline{S_1}F^c)\overline{B} \quad (19)$$

$$F_{out}=S_1 \quad (20)$$

IV. Experimental Verification

In this section, the functioning of disclosed gate-open failure detection technique was experimentally verified for all the possible failure scenarios. The highly intermittent and unpredictable nature of gate-open failures makes it nearly impossible to recreate these faults on-demand. This was especially important since, as previously discussed in Section I, the exact instance of fault occurrence determines the state of the failed MOSFET's gate and consequently its behavior under fault. Therefore, in order to comprehensively validate the functioning of the disclosed detection technique under different failure scenarios, a gate-open fault emulation technique was used. The schematic of the experimental gate-open failure detection circuit was shown in FIG. 21a. The DUT was plugged into this detection circuit and the board itself has external connections compatible with a TO-247 PCB footprint. The external drain and source connections are routed directly to the respective DUT leads. The gate connection, however, passes through an ultrafast reed relay. Under normal operation, the relay was closed and the DUT behaves normally. To emulate a gate-open fault, the relay was opened which mimics the physical disconnection of the gate bond wire under actual failure. The picture of the developed prototype board was shown in FIG. 21b. The gate voltage applied by the gate driver was sensed for failure detection purpose. The previously discussed failure detection logic was implemented on the onboard microcontroller (MCU) which generates the fault signals. In actual applications, the logic can be implemented directly on the main control MCU. The disclosed detection technique was experimentally verified under all failure scenarios using a synchronous boost topology. In the following sub-sections, the gate-open failure emulation strategy was first verified followed by verification of the disclosed detection technique.

A. Characterization and Verification of Gate-Open Failure Emulation Technique

In order to reliably emulate gate-open failure during converter operation, it necessary to precisely time the opening of the reed relay with respect to the applied gate signals. To this end, the relay release time was experimentally characterized, the results of which are shown in Table V.

TABLE V

Characterization of Relay Time

| Gate Voltage | Release Time |
|---|---|
| 5 V | 4.68 µs |
| 8 V | 5.24 µs |
| 12 V | 5.76 µs |

Based on the values in the table, the worst-case relay opening time can be approximated to <10 µs. Consequently, for 10 kHz converter operating frequency and D=0.5, the relay should operate within half of the switching period (=50 µs). This was verified in actual converter operation as shown in FIG. 16. The relay was commanded to open soon after the DUT turns off, as indicated by the falling edge of the relay drive signal ($S_{relay}$). In the subsequent on interval, although the gate driver voltage ($V_{g-DUT}{}^{GD}$) was high, the actual DUT gate voltage ($V_{g-DUT}{}^{actual}$) remains low. This floating gate behavior was consistent with a gate-open fault. Similarly, if the relay was open when ($V_{g-DUT}{}^{actual}$) was high, it will remain high even when ($V_{g-DUT}{}^{GD}$) was low. It must be noted that for these experiments, the relay was reconnected after 1-2 switching intervals to allow normal converter operation. The theoretical fault interval was given by $T_f$, at the end of which the relay closes (including contact bounce) and ($V_{g\text{-}DUT}^{GD}$) starts following ($V_{g\text{-}DUT}^{GD}$).

B. Verification of Failure Detection Under Q1 Operation

Figure 23:
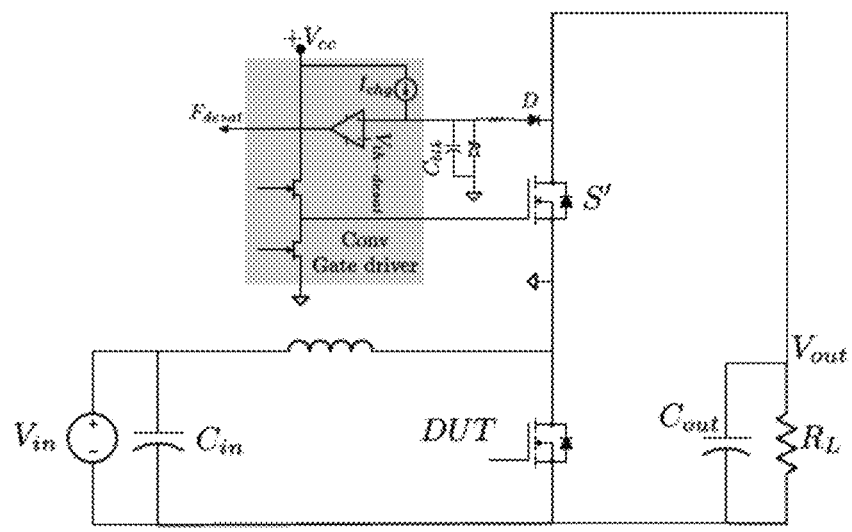
FIG. 23 is a schematic of a synchronous boost converter used for experimental validation of a gate-open failure detection circuit in some embodiments according to the invention.

The synchronous boost configuration used to verify failure detection under Q1 operation of the DUT was shown in FIG. 23. The specifications of the boost converter are as follows—$V_{in}$=50V, $V_{out}$=100V, $f_{sw}$=10 kHz, D=0.5, $C_{in}$=50 pF, $C_{out}$=1800 pF and RL=180Ω. For Q1 operation, the DUT was configured as the low side switch and S' was the complimentary high-side switch. Under Q1 operation of the DUT, an open or conduction type gate-open failure may occur as discussed in Section I. Each of these scenarios was verified below.

1) Q1 Open Fault: FIG. 24a shows the waveform for verification of Q1 open fault detection. The gate relay was opened when $S_{relay}$ goes low. In the subsequent on period, the DUT fails to turn on. Consequently, even though the complimentary synchronous switch was off (PW $M_{S'}$), its body-diode was forward biased and the drain-source voltage across the DUT ($V_{ds\text{-}DUT}$) remains at 100V as shown in the figure. Therefore, Q1 open fault ($F_{open\text{-}Q1}$) was raised during the DUT's on interval. The timing of the fault signal was verified in FIG. 24b. As seen, the delay between rising edges of ($V_{g\text{-}DUT}^{GD}$) and $F_{open\text{-}Q1}$ was 120 ns. This delay includes the delay caused by comparators, digital isolator, and blanking interval.

2) Q1 Conduction Fault: FIG. 25a shows the experimental waveforms in case of a conduction fault. In this case, the gate relay was opened when $V_{g\text{-}GD}$ was high to emulate an on period gate-open fault. As seen, the DUT fails to turn off when $V_{g\text{-}GD}$ goes low. In the figure, this condition was represented by $V_{ds}$ remaining low when DUT should turn on. The fault output ($F_{cond\text{-}Q1}$) was used as a trip signal for the PWM generator. Therefore, it seen that the gate signals of both the DUT and S' are low after the fault was raised. The timing of the fault signal was shown in FIG. 25b. $F_{cond\text{-}Q1}$ goes high 150 ns after $V_{g\text{-}GD}$ goes low. This was lower than the deadtime between the high side and low side switching signals which, for this experiment, was set at a fixed value of 400 ns. Therefore, the gate signal for S' remains low because of PWM trip action. Consequently, fast fault detection prevents a shoot-through event in case of conduction type gate-open failure scenario.

C. Verification of Failure Detection Under Q3 (Synchronous) Operation

For experimental verification of failure detection in Q3 mode of operation, the position of S' and DUT in FIG. 23 was interchanged. Specifically, the DUT operated as the synchronous switch. The experimental waveforms for verification of disclosed gate-open failure detection technique in Q3 open type fault scenario in shown in FIG. 26a. As seen when the relay was opened, ($V_{g\text{-}DUT}^{actual}$) remains low even during the on intervals. Moreover, as discussed in Section I, ($V_{g\text{-}DUT}^{actual}$) becomes more negative when the diode turns on which was indicated by large negative $V^{ds\text{-}DUT}$. For these intervals it was seen that $F_{open\text{-}Q3}$ was high. The timing of the fault signal was verified in FIG. 26b. Unlike the previous cases, it seen that $F_{open\text{-}Q3}$ was asserted 800 ns after PW Ms-rising edge. It was because, for Q3 open faults, the blanking time necessarily has to be greater than switching dead-time. Since the body-diode was on during the deadtime, using a blanking value less than that would trigger a false positive. Moreover, since this a safe failure mode, the delay in failure detection was not a significant factor as long as the fault was detected within the off period.

D. Comparison of Disclosed Technique to Traditional DESAT Protection Scheme

DESAT protection schemes were traditionally used to protect the switching device against high-current events that may occur during faults. Many modern commercial gate drivers have built-in DESAT protection feature. A typical DESAT protection circuit was shown across S' in FIG. 23. In case of a fault, when $V_{ds}^{S'}$ exceeds $V_{cc}+V_D$, the current source starts charging the blanking capacitor $C_{blk}$. When voltage across the blanking capacitor exceeds the desat threshold ($V_{th\text{-}desat}$), the switch was turned off and a fault signal was raised. Conventional DESAT protection scheme was compared to the disclosed gate-open failure detection technique for different gate-open failure scenarios as described below.

1) Q1 Open Fault: In this case, if present, DESAT protection of the faulty switch was triggered since the switch was in blocking state and $I_{chg}$ charges $C_{blk}$. However, the conventional DESAT scheme will not able to differentiate between an open fault caused by gate-open failure and an over-current saturation fault. On the other hand, the disclosed fault detection circuit was triggered only in case of a Q1 open fault caused by gate-open failure. As described above, the disclosed gate-open failure detection circuit was not active throughout the on/off interval and only makes a single shot detection at the end of blanking period which in this case was 60 ns. Since most switches are unlikely to saturate within this time, saturation fault in most cases will not trigger $F_{open\text{-}Q1}$.

Figure 27:
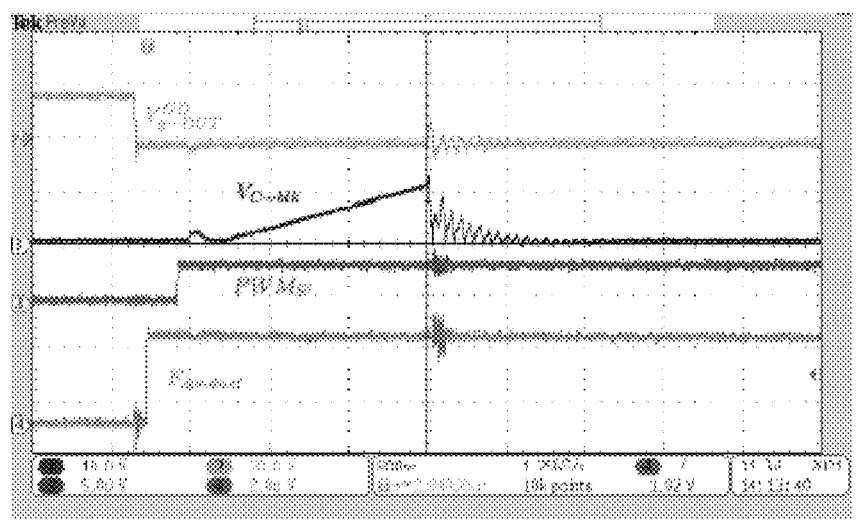
FIG. 27 is a graph showing a comparison of a fault detection circuit in some embodiments according to the invention to a conventional DESEAT protection scheme.

2) Q1 Conduction Fault: In case of a conduction type gate-open fault, the resulting shoot-through event may trigger the DESAT protection feature of the complimentary switch's gate driver which could theoretically protect against a conduction gate-open fault. FIG. 27 shows the comparison between the disclosed fault detection technique and DESAT scheme. The setup was similar to FIG. 23. However, $F_{conduct}$ does not trip the PWM outputs in this case. For the conventional gate driver used, $C_{blk}$=60 pF, $I_{chg}$=0.5 mA and $V_{th\text{-}desat}$=9V. It was seen that it takes 2:5 μs from PW $M_{S'}$, rising edge to DESAT fault getting triggered. As shown above, with the disclosed technique, $F_{conduct}$ was asserted in 150 ns and since this was less than the dead-time, PWM was tripped and shoot-through was prevented. In the case of DESAT based protection, however, a shoot-through current was necessary to saturate the switches and trigger the fault. This was especially important since SiC MOSFETs unlike Si IGBTs have lower shortcircuit withstand capability due to their relatively smaller die size. Moreover, SiC MOSFETs do not have a well-defined knee point on the output curve and have high power dissipation in saturation. In addition, the shoot-through event may cause thermal runway in not only the power switches but also to other system components as well. Furthermore, DESAT scheme cannot different between saturation event caused by gateopen fault or a different fault mechanism. Because of these reasons, the disclosed gate-open failure detection has advantages over traditional protection schemes in detecting conduction type fault.

3) Q3 Open Fault: Conventional DESAT scheme cannot detect this fault type since it was deactivated during the switch off time. Moreover, since this was a soft failure where the converter may seem to be healthy apart from deteriorated efficiency, it was very challenging for most conventional protection mechanism to detect open failure in Q3 operation. Therefore, the disclosed failure detection circuit can reliably detect Q3 open type failures. This was especially useful since the intermittent nature of gate-open failure may cause the device to recover from Q3 open failure and later show conduction type failure.

As presented herein, intermittent gate-open failure was investigated in the context of discrete SiC devices. The electrical behavior of MOSFET under gate-open failure was first analyzed. Failed devices from DC power cycling test were inspected analyzed using a systematic multi-step process. Given the intermittent and elusive nature of gate-open failure, the methods used in this article maybe be used as a guide for gate-open failure analysis. FEA analysis was used to identify potential mechanism for gate-open failure. While the gate-bond itself does not carry a large current, it was shown that it experiences interfacial shear stress due to deformation caused by CTE mismatch between various device elements. A larger CTE mismatch between EMC and copper drain tab was shown to increase the maximum shear stress. Thereafter, an on-board failure detection technique was used for all types of gate-open failure modes. The specific nature of gate-open failure was exploited to create a fast failure detection technique that was inherently selective and robust. Through comparison and experimental verification, it shown that the disclosed technique was not only capable of detecting all gate-open failure modes but also differentiate between gate-open failure and other failure modes. Specifically, potentially dangerous conduction type failure mode was detected within the switching dead-time, thus preventing a shoot-through event in switching leg.

The terminology used herein is for the purpose of describing embodiments only and is not intended to be limiting to other embodiments. As used herein, the singular forms "a", "an" and "the" are intended to include the plural forms as well, unless the context clearly indicates otherwise. It will be further understood that the terms "comprises," "comprising," "includes" and/or "including", "have" and/or "having" when used herein, specify the presence of stated features, integers, steps, operations, elements, and/or components, but do not preclude the presence or addition of one or more other features, integers, steps, operations, elements, components, and/or groups thereof. Elements described as being "to" perform functions, acts and/or operations may be configured to or other structured to do so.

Unless otherwise defined, all terms (including technical and scientific terms) used herein have the same meaning as commonly understood by one of ordinary skill in the art to which various embodiments described herein belong. It will be further understood that terms used herein should be interpreted as having a meaning that is consistent with their meaning in the context of this specification and the relevant art and will not be interpreted in an idealized or overly formal sense unless expressly so defined herein.

As will be appreciated by one of skill in the art, various embodiments described herein may be embodied as a method, data processing system, and/or computer program product. Furthermore, embodiments may take the form of a computer program product on a tangible computer readable storage medium having computer program code embodied in the medium that can be executed by a computer.

Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device. Program code embodied on a computer readable signal medium may be transmitted using any appropriate medium, including but not limited to wireless, wired, optical fiber cable, RF, etc., or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB.NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages, such as a programming language for a FPGA, Verilog, System Verilog, Hardware Description language (HDL), and VHDL. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computer environment or offered as a service such as a Software as a Service (SaaS).

Some embodiments are described herein with reference to flowchart illustrations and/or block diagrams of methods, systems, and computer program products according to embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create a mechanism for implementing the functions/acts specified in the flowchart and/or block diagram block or blocks.

These computer program instructions may also be stored in a computer readable medium that when executed can direct a computer, other programmable data processing apparatus, or other devices to function in a particular manner, such that the instructions when stored in the computer readable medium produce an article of manufacture including instructions which when executed, cause a computer to implement the function/act specified in the flowchart and/or block diagram block or blocks. The computer program instructions may also be loaded onto a computer, other programmable instruction execution apparatus, or other devices to cause a series of operational steps to be performed on the computer, other programmable apparatuses or other devices to produce a computer implemented process such that the instructions which execute on the computer or other programmable apparatus provide processes for implementing the functions/acts specified in the flowchart and/or block diagram block or blocks.

It is to be understood that the functions/acts noted in the blocks may occur out of the order noted in the operational illustrations. For example, two blocks shown in succession may in fact be executed substantially concurrently or the blocks may sometimes be executed in the reverse order, depending upon the functionality/acts involved. Although some of the diagrams include arrows on communication paths to show a primary direction of communication, it is to be understood that communication may occur in the opposite direction to the depicted arrows.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall support claims to any such combination or subcombination.

While the foregoing is directed to aspects of the present disclosure, other and further embodiments of the disclosure may be devised without departing from the basic scope thereof, and the scope thereof is determined by the claims that follow.

The invention claimed is:

1. A system to detect gate-open failures in a MOS based insulated gate transistor, comprising:
a detection circuit, comprising:
a first circuit configured to measure a drain-source voltage across the MOS based insulated gate transistor;
a first comparator circuit configured to compare the measured drain-source voltage to a threshold drain-source conduction voltage indicating a conduction state of a channel of the MOS based insulated gate transistor;
a second circuit configured to measure a gate voltage applied at a gate of the MOS based insulated gate transistor;
a second comparator circuit configured to compare the gate voltage applied at the gate to a threshold gate voltage for the MOS based insulated gate transistor to provide an indication of whether the gate voltage applied at the gate is sufficient to activate conduction in the channel;
a third comparator circuit configured to compare the measured drain-source voltage to a forward bias threshold voltage for an internal anti-parallel diode of the MOS based insulated gate transistor to provide an indication of a conduction state of the internal anti-parallel diode; and
a logic circuit configured to detect a gate-open failure of the MOS based insulated gate transistor based on the conduction state of the channel, the indication of the conduction state of the internal anti-parallel diode, and the indication of whether the gate voltage applied at the gate is sufficient to activate conduction in the channel when the MOS based insulated gate transistor is in an on state or an off state.

2. The system of claim 1, wherein the insulated gate transistor comprises a SiC insulated gate bipolar transistor or a SiC MOS field effect transistor.

3. The system of claim 1, wherein the first circuit comprises a first resistor network, and wherein the second circuit comprises a second resistor network.

4. The system of claim 1, wherein the first circuit comprises a current source.

5. The system of claim 1, wherein the logic circuit comprises a fault detection logic implemented using a plurality of combinational lookup table elements and a plurality of fault finite state machines.

6. The system of claim 5, wherein the logic circuit further comprises a blanking logic comprises a blank finite state machine and a counter.

7. A system for detecting gate-open failures in an insulated gate transistor, comprising:
a detection circuit, comprising:
a first resistor network configured to measure a drain-source voltage across the insulated gate transistor;
a first comparator configured to compare the measured drain-source voltage with a first threshold voltage;
a second comparator configured to compare the measured drain-source voltage with a second threshold voltage;
a second resistor network configured to measure a gate voltage of the insulated gate transistor; and
a third comparator configured to compare the measured gate voltage with a third threshold voltage; and
a logic unit configured to detect a gate-open failure based on an output of the first comparator, an output of the second comparator, and an output of the third comparator.

8. The system of claim 7, wherein the first resistor network comprises a diode and at least three resistors, wherein the diode is configured to block an off-state voltage across the insulated gate transistor.

9. The system of claim 7, wherein the second resistor network comprises at least three resistors.

10. The system of claim 7, wherein the first threshold voltage is about 2.5 V.

11. The system of claim 7, wherein the second threshold voltage is about −2.5 V.

12. The system of claim 7, further comprising a digital isolator to provide galvanic isolation between grounds in the detection circuit and grounds in the configurable logic block.

13. The system of claim 7, wherein the logic unit comprises a fault detection logic implemented using combinational lookup table elements and fault finite state machines.

14. The system of claim 7, wherein the logic unit further comprises a blanking logic, wherein the blank logic comprises a blank finite state machine and a counter, wherein the blank logic is configured to automatically provide an input hysteresis within a blanking time window to the fault finite state machines during transition events of the insulated gate transistor.

15. The system of claim 7, wherein the system is operable to detect a gate-open failure at about 150 ns.

16. The system of claim 7, wherein the open-gate failure is a conduction fault, wherein the gate voltage is off and the insulated gate transistor fails to turn off.

17. The system of claim 7, wherein the open-gate failure is an open fault, wherein the gate voltage is on and the insulated gate transistor fails to turn on in a first quadrant.

18. The system of claim 7, wherein the open-gate failure is an open fault, wherein the gate voltage is on and the insulated gate transistor fails to turn on in a third quadrant.

19. A method of detecting gate-open failures in a MOS based insulated gate transistor, comprising:
measuring a drain-source voltage across the MOS based insulated gate transistor;
comparing the measured drain-source voltage to a first threshold voltage indicating a conduction state of a channel of the MOS based insulated gate transistor in a first quadrant of operation of the MOS based insulated gate transistor;
measuring a gate voltage applied at a gate of the MOS based insulated gate transistor;
comparing the gate voltage applied at the gate to a second threshold voltage for the MOS based insulated gate transistor to provide an indication of whether the gate voltage applied at the gate is sufficient to activate conduction in the channel;
comparing the measured drain-source voltage to a third threshold voltage indicating a conduction state of an internal anti-parallel diode of the MOS based insulated gate transistor in a third quadrant of operation of the MOS based insulated gate transistor;
detecting a gate-open failure of the MOS based insulated gate transistor in the first quadrant of operation and the third quadrant of operation based on the conduction state of the channel, the conduction state of the internal anti-parallel diode and the indication of whether the gate voltage applied at the gate is sufficient to activate conduction in the channel when the MOS based insulated gate transistor is in an on state or an off state.

20. A method of detecting gate-open failures in an insulated gate transistor, comprising:
measuring a drain-source voltage across the insulated gate transistor;
identifying a conduction state of a channel of the insulated gate transistor based on the measured drain-source voltage;
measuring an applied gate voltage at the insulated gate transistor;
identifying a state of the applied gate voltage based on the applied gate voltage;
identifying a conduction state of an internal anti-parallel diode of the insulated gate transistor based on the measured drain-source voltage; and
detecting gate-open failures when the insulated gate transistor is operating in a first quadrant and operating in a third quadrant based on the conduction state of the channel, the conduction state of the internal anti-parallel diode, and the state of the applied gate voltage.

21. The method of claim 20, wherein the identifying a conduction state of the channel of the insulated gate transistor based on the measured drain-source voltage comprising comparing the measured drain-source voltage with a threshold drain-source conduction voltage.

22. The method of claim 20, wherein identifying the conduction state of the internal anti-parallel diode comprises comparing the measured drain-source voltage with a threshold body-diode conduction voltage.

23. The method of claim 20, further comprising:
inputting the conduction state of the channel, the conduction state of the internal anti-parallel diode, and the state of the applied gate voltage to fault detection logic comprising a plurality of combinational lookup table elements and a plurality of fault finite state machines.

24. The method of claim 23, further comprising:
blanking logic coupled to the fault detection logic to differentiate true failures from noise-related transition events.

* * * * *

UNITED STATES PATENT AND TRADEMARK OFFICE
CERTIFICATE OF CORRECTION

PATENT NO. : 11,585,844 B1
APPLICATION NO. : 17/470064
DATED : February 21, 2023
INVENTOR(S) : Vankayalapati et al.

It is certified that error appears in the above-identified patent and that said Letters Patent is hereby corrected as shown below:

In the Specification

Column 6, Line 50: Please correct "FIG. 3b, $V_{gs}^{f} = 100V$," to read --FIG. 3b, $V_{dg}^{pf} = 100V$--

Column 11, Line 31: Please correct "$V_{ds-sense}^{ch-th}$" to read --$V_{ds-sense}^{ch-th}$--

Line 32: Please correct "$V_{ds-sense}^{bd-th}$" to read --$V_{ds-sense}^{bd-th}$--

Line 52: Please correct "$I_{max}^{+} =$" to read --$I_{max}^{+} =$--

Line 55: Please correct "$I_{max}^{-} =$" to read --$I_{max}^{-} =$--

Line 58: Please correct "$V_{ds}^{ch-th} =$" to read --$V_{ds}^{ch-th} =$--

Column 12, Line 2: Please correct "$V_{ds}^{bd-th} =$" to read --$V_{ds}^{bd-th} =$--

Column 13, Table IV, heading: Device state-of-health: Please correct:

Line 3: "($F_{open\_Q1}^{c}$)" to read --$(F_{open-Q1}^{c})$--

Line 8: "($F_{conduct}^{c}$)" to read --$(F_{conduct}^{c})$--

Line 15: "($F_{open\_Q3}^{c}$)" to read --$(F_{open-Q3}^{c})$--

Column 13, Lines 20-21: Please correct "($F_{conduct}^{c}$, $F_{open\_Q1}^{c}$, and $F_{open\_Q3}^{c}$)" to read --$(F_{conduct}^{c}, F_{open-Q1}^{c}, and\ F_{open-Q3}^{c})$--

Signed and Sealed this
Eighth Day of October, 2024

Katherine Kelly Vidal
*Director of the United States Patent and Trademark Office*

CERTIFICATE OF CORRECTION (continued)
U.S. Pat. No. 11,585,844 B1

Column 14, Line 61: Please correct "($V_{g-DUT}^{GD}$)" to read -- $\left(V_{g-DUT}^{GD}\right)$ --

Line 62: Please correct "($V_{g-DUT}^{actual}$)" to read -- $\left(V_{g-DUT}^{actual}\right)$ --

Line 64: Please correct "($V_{g-DUT}^{actual}$)" to read -- $\left(V_{g-DUT}^{actual}\right)$ --

Line 65: Please correct "($V_{g-DUT}^{GD}$)" to read -- $\left(V_{g-DUT}^{GD}\right)$ --

Column 15, Line 3: Please correct "($V_{g-DUT}^{GD}$)" to read -- $\left(V_{g-DUT}^{GD}\right)$ --

Lines 8-9: Please correct "$C_{in}$ = 50$pF$, $C_{out}$ = 1800$pF$" to read -- $C_{in}$ = 50$\mu F$, $C_{out}$ = 1800$\mu F$ --

Line 26: Please correct "($V_{g-DUT}^{GD}$)" to read -- $\left(V_{g-DUT}^{GD}\right)$ --

Line 54: Please correct "($V_{g-DUT}^{actual}$)" to read -- $\left(V_{g-DUT}^{actual}\right)$ --

Line 56: Please correct "($V_{g-DUT}^{actual}$)" to read -- $\left(V_{g-DUT}^{actual}\right)$ --

Line 61: Please correct "Ms-rising edge" to read -- $M_{s'}$ rising edge --

Column 16, Line 8: Please correct "$V_{ds}^{S'}$" to read -- $V_{ds}^{S'}$ --

Line 41: Please correct "$M_{s'}$, rising" to read -- $M_{s'}$ rising --